(12) United States Patent
Terashima et al.

(10) Patent No.: US 10,322,680 B2
(45) Date of Patent: Jun. 18, 2019

(54) ACTIVE VIBRATION AND NOISE CONTROL DEVICE AND ACTIVE VIBRATION AND NOISE CONTROL CIRCUIT

(71) Applicant: HONDA MOTOR CO., LTD., Minato-ku, Tokyo (JP)

(72) Inventors: Osamu Terashima, Wako (JP); Toshio Inoue, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 0 days.

(21) Appl. No.: 16/075,153

(22) PCT Filed: Jan. 13, 2017

(86) PCT No.: PCT/JP2017/000990
§ 371 (c)(1),
(2) Date: Aug. 3, 2018

(87) PCT Pub. No.: WO2017/135012
PCT Pub. Date: Aug. 10, 2017

(65) Prior Publication Data
US 2019/0071026 A1 Mar. 7, 2019

(30) Foreign Application Priority Data
Feb. 5, 2016 (JP) .................. 2016-020632

(51) Int. Cl.
*B60R 11/02* (2006.01)
*F16F 15/02* (2006.01)
(Continued)

(52) U.S. Cl.
CPC .............. *B60R 11/02* (2013.01); *F16F 15/02* (2013.01); *G10K 11/175* (2013.01); *H03H 17/06* (2013.01); *H03H 21/00* (2013.01)

(58) Field of Classification Search
CPC ........ B60R 11/02; F16F 15/02; G10K 11/175; H03H 17/06; H03H 21/00
See application file for complete search history.

(56) References Cited

U.S. PATENT DOCUMENTS

2009/0060217 A1 3/2009 Sakamoto et al.
2011/0123042 A1 5/2011 Sakamoto et al.
2012/0032619 A1 2/2012 Kobayashi et al.

FOREIGN PATENT DOCUMENTS

JP 0784585 A * 3/1995
JP 07-104767 4/1995
(Continued)

OTHER PUBLICATIONS

English machine translation of JP-10187164-A (Kimura, Takeshi; Active Vibration Controller; Jul. 1998).*
(Continued)

*Primary Examiner* — Mark Fischer
(74) *Attorney, Agent, or Firm* — Amin, Turocy & Watson LLP

(57) ABSTRACT

An active vibration and noise control device robust against outside disturbances, and an active vibration and noise control circuit are provided. An adaptive control circuit of this active vibration and noise control device has autocorrelation value calculation units which calculate an autocorrelation value of an error signal or of a target signal, which is a reference signal or a standard signal, and a canceling output limiting unit which determines whether or not an autocorrelation value is less than an autocorrelation threshold value, and limits increases in the cancelling output if it is determined that the autocorrelation value is less than the autocorrelation threshold value.

14 Claims, 14 Drawing Sheets

(51) Int. Cl.
*G10K 11/175* (2006.01)
*H03H 17/06* (2006.01)
*H03H 21/00* (2006.01)

(56) References Cited

FOREIGN PATENT DOCUMENTS

| JP | 07248784 A | * | 9/1995 |
|---|---|---|---|
| JP | 10187164 A | * | 7/1998 |
| JP | 10-214119 | | 8/1998 |
| JP | 2003216163 A | * | 7/2003 |
| JP | 2009-292201 | | 12/2009 |

OTHER PUBLICATIONS

English machine translation of JP-2003216163-A (Shiotani, Takeshi; Noise Controller; Jul. 2003).*
English machine translation of JP-07248784-A (Yamada, Koji; Active Noise Controller; Sep. 1995).*
English machine translation of JP-0784585-A (Hamabe, Tsutomu; Active Noise Controller; Mar. 1995).*
International Search Report and Written Opinion for International Application No. PCT/JP2017/000990 dated Feb. 28, 2017, 8 pages.

* cited by examiner

ACTIVE VIBRATION AND NOISE CONTROL DEVICE AND ACTIVE VIBRATION AND NOISE CONTROL CIRCUIT

TECHNICAL FIELD

The present invention relates to an active vibration noise control apparatus and an active vibration noise control circuit that generate canceling output corresponding to a target noise or a canceling output corresponding to a target vibration to cancel a target noise or a target vibration. More particularly, the present invention relates to an active vibration noise control apparatus and an active vibration noise control circuit that cancels the target noise or the target vibration by using a so-called adaptive control.

BACKGROUND ART

As an apparatus for suppressing vibration noise in the passenger compartment, an active noise control apparatus (hereinafter referred to as "ANC apparatus") has been known. Further, as an apparatus for suppressing vibration itself or vibration noise in the vehicle interior, an active vibration control apparatus (hereinafter referred to as "AVC apparatus") has been known.

In a general ANC apparatus, the target noise is reduced by outputting from the speaker in the vehicle interior an anti-phase canceling sound with respect to the target noise. The error between the target noise and the canceling sound is detected as residual noise by a microphone disposed in the vicinity of the ear of the occupant, and is used for subsequent determination of canceling sound. The ANC apparatus may reduce, for example, vehicle interior noise (engine muffled sound) in response to engine vibration or vehicle interior noise (road noise) caused by the wheels of a moving vehicle in contact with the road surface (see, for example, Japanese Laid-Open Patent Publication No. 07-104767 (hereinafter referred to as "JP 07-104767 A") and U.S. Patent Application Publication No. 2009/0060217 (hereinafter referred to as "US 2009/0060217 A1") reference).

In a general AVC apparatus, vibration generated in opposite phase to the target vibration is generated by an actuator, thereby reducing the target vibrations transmitted to the vehicle interior. The error between the target vibration and the canceling vibration is detected as a residual vibration by a vibration sensor disposed in the vicinity of the actuator, and it is used to determine subsequent canceling vibration. For example, the AVC apparatus suppresses transmission of engine vibration to the vehicle interior (see, for example, U.S. Patent Application Publication No. 2012/0032619 (hereinafter referred to as "US 2012/0032619 A1")).

In JP 07-104767 A and US 2009/0060217 A1, an adaptive control is used to generate a canceling sound. More specifically, in JP 07-104767 A, the first basic signal X1 based on the engine speed [rpm] is multiplied by the filter weight Wim in the first adaptive filter group 32 to generate the speaker drive signal Yim (FIG. 1, [0018]). As a result, the engine noise is reduced. The filter weight Wim is calculated based on the first basic signal X1 and the detection signal e1 from the microphone 40 ((0021)). Further, similar controls are also carried out for road noise (vibration detected by the input vibration detection unit 18) and wind noise (sound pressure detected by the input sound pressure detection unit 24) ([0022]).

Also, in US 2009/0060217 A1, the first basic signal generator 31 generates a first basic signal Sr1 synchronized with the road noise frequency fd (FIG. 1, [0042]). The first adaptive filter 36 generates a first control signal SC1 from the first basic signal Sr1 (FIG. 1, [0042]). The filter coefficient W1 used in the first adaptive filter 36 is set by the filter coefficient updating unit 38 ([0042], [0043]).

The filter coefficient updating unit 38 calculates the filter coefficient W1 based on the reference signal r from the reference signal generation unit 34, the error signal ea from the microphone 22, etc. ([0042]). The reference signal generation unit 34 calculates the reference signal r based on the simulated transfer characteristic C^([0042]).

In US 2012/0032619 A1, the canceling vibration is generated using an adaptive control. Specifically, the frequency identifying unit 83a (FIG. 6) identifies the frequency of engine vibration in the vibration mode of the maximum amplitude based on the TDC pulse signal and the CRK pulse signal ([0120]). The basic signal generation unit 83b generates a basic signal based on the frequency identified by the frequency identifying unit 83a ([0121]). The adaptive filter unit 83d generates an optimal cancellation signal based on the calculation result (filter coefficient) of the least squares calculation unit 83c ([0129]). The least squares calculation unit 83c calculates an optimal cancellation signal based on input signals from the basic signal generation unit 83b and the vibration sensor 29 ([0126] to [0129]).

The drive control unit 83e outputs an output signal based on an input signal from the adaptive filter unit 83d to the drive circuit 53A ([0130], [0131]). The drive circuit 53A drives the actuator 30 based on an input signal from the drive control unit 83e ([0168]).

SUMMARY OF INVENTION

As described above, in the ANC apparatus and the AVC apparatus (hereinafter, both are collectively referred to as "active vibration noise control apparatus", the filter coefficient of the adaptive filter is calculated (or updated) based on the reference signal (or the basic signal) and the error signal. In the calculation of the filter coefficient, when the basic signal, the reference signal or the error signal involves disturbance, divergence of control or unintended canceling sound or vibration (hereinafter, both are collectively referred to as "canceling output") may occur. JP 07-104767 A, US 2009/0060217 A1 and US 2012/0032619 A1 do not study this point.

An object of the present invention is to provide an active vibration noise control apparatus and an active vibration noise control circuit that are robust against disturbance, which has been made in view of the above problem.

An active vibration noise control apparatus according to the present invention comprises: a basic signal generating unit configured to output a basic signal indicating a target input which is a target noise or a target vibration; an adaptive control circuit configured to perform an adaptive control on the basic signal to output a control signal; a canceling output generation unit configured to generate a canceling output as a canceling sound for the target noise or a canceling vibration for the target vibration based on the control signal; and an error detecting unit configured to detect an error as a difference between the canceling output and the target input at a certain evaluation point and output an error signal, wherein the adaptive control circuit comprises: an adaptive filter configured to generate the control signal on a basis of the basic signal or a reference signal based on the basic signal; a filter coefficient computing unit configured to calculate a filter coefficient of the adaptive filter based on the basic signal or the reference signal and the error signal; an autocorrelation value calculation unit configured to calculate an autocorrelation value of the target signal as the error signal or the basic or reference signal; and a canceling output limiting unit configured to determine whether or not the autocorrelation value is smaller than a autocorrelation threshold value, and limit an increase in the canceling output in a case where it is determined that the autocorrelation value is smaller than the autocorrelation threshold value.

According to the present invention, in a case where it is determined that the autocorrelation value of the target signal as the error signal or the basic or reference signal is lower than the autocorrelation threshold value, the increase in the canceling output is limited. As a result, when the influence of the disturbance entering the error signal, the basic signal or the reference signal is large, the divergence of control or the occurrence of an unintended canceling output can be prevented by limiting the increase in the canceling output (canceling sound or canceling vibration).

The autocorrelation value calculation unit may calculate the autocorrelation value of the target signal in a case where the frequency of the target signal is higher than an allowable lowest frequency. In addition, the autocorrelation value calculation unit may not calculate the autocorrelation value in a case where the frequency of the target signal is lower than the allowable lowest frequency.

In a case where the frequency of the target signal is relatively low, the variation of the autocorrelation value tends to be large. Therefore, in a case where the frequency of the target signal is relatively low, it is possible to limit the increase in the canceling output at an appropriate situation by not calculating the autocorrelation value.

The autocorrelation value calculation unit may acquire the vehicle speed of the vehicle in which the active vibration noise control apparatus is disposed, and may switch the allowable lowest frequency according to the vehicle speed. Thus, by switching the use of the autocorrelation value according to the vehicle speed, it is possible to suppress the increase of the filter coefficient at an appropriate situation.

The adaptive control circuit determines whether or not the amplitude of the target signal is greater than an amplitude threshold value, and may limit an increase in the filter coefficient regardless of whether the autocorrelation value exceeds the autocorrelation threshold value or not in a case where the amplitude of the target signal is greater than an amplitude threshold value. In this manner, in a case where the amplitude of the target signal becomes excessively large, the divergence of the control or the occurrence of an unintended canceling output (canceling sound or canceling vibration) can be prevented by limiting the increase of the filter coefficient.

The adaptive control circuit may calculate differences between a previous effective value and a current effective value of the first error signal and the second error signal, and determine whether or not the differences between the effective values exceed a difference threshold value. The adaptive control circuit may limit an increase in the filter coefficient regardless of whether the autocorrelation value exceeds the autocorrelation threshold value or not in a case where the differences between the effective values exceed the difference threshold value. In this manner, in a case where the amplitude of the target signal becomes excessively large, the divergence of the control or the occurrence of an unintended canceling output (canceling sound or canceling vibration) can be prevented by limiting the increase of the filter coefficient.

The adaptive control circuit may acquire an air volume of an air conditioner of the vehicle in which the active vibration noise control apparatus is disposed, and determine whether the air volume exceeds an air volume threshold value. Then, in a case where the air volume exceeds the air volume threshold value, the adaptive control circuit may limit the increase of the filter coefficient regardless of whether or not the autocorrelation value exceeds the autocorrelation threshold value. In this manner, in a case where the air volume of the air conditioner becomes excessively large, the divergence of the control or the occurrence of an unintended canceling output (canceling sound or canceling vibration) can be prevented by limiting the increase of the filter coefficient.

The adaptive control circuit specifies whether or not a window of a vehicle in which the active vibration noise control apparatus is disposed is in an open state, and if the window is in the open state, the adaptive control circuit may limit the increase of the filter coefficient regardless of whether or not the autocorrelation value exceeds the autocorrelation threshold value. Thus, when the window of the vehicle is in the open state, the divergence of the control or the occurrence of an unintended canceling output (canceling sound or canceling vibration) can be prevented by limiting the increase of the filter coefficient.

The autocorrelation value calculation unit may set a window length of a window function that specifies an extraction portion for calculating the autocorrelation value from the target signal, and calculate the autocorrelation value with respect to the extracted portion specified by using the window length. Further, the autocorrelation value calculation unit may obtain the rotational speed of the running drive source of the vehicle in which the active vibration noise control apparatus is disposed, and change the window length of the window function according to the rotational speed of the running drive source.

Thus, the range of the extracted portion of the target signal used for calculating the autocorrelation value is changed in accordance with the rotational speed of the running driving source (engine, traction motor, etc.). When the rotational speed of the running drive source is high, the main components of the target signal are high-frequency components. In this case, for example, by shortening the window length of the window function, it is possible to shorten the calculation cycle of the autocorrelation value or to improve the detection accuracy of the autocorrelation value (since the influence of the low frequency component becomes small).

The autocorrelation value calculation unit may estimate the frequency of the target signal based on the rotational speed of the running drive source, and set the reciprocal of the estimated frequency as the window length of the window function. This makes it possible to set the window length of the window function by a relatively simple method.

In a case where the error detection unit is a microphone and the target signal contains the error signal, the adaptive control circuit may determine whether or not the voice recognition device of the vehicle where the active vibration noise control apparatus is disposed is performing voice recognition. In a case where the voice recognition device is performing the voice recognition, the adaptive control circuit may allow an increase in the filter coefficient regardless of whether or not the autocorrelation value falls below the autocorrelation threshold value.

As a result, even when a disturbance occurs in the error signal (the target signal) in accordance with the voice input to the microphone, the generation of the canceling output (canceling sound or canceling vibration) is continued. Therefore, it is possible to prevent the difficulty of voice recognition by restricting an increase in canceling output during voice recognition.

The canceling output limiting unit may determine whether or not the autocorrelation value falls below the autocorrelation threshold value at every predetermined period, and may count the number of times that the autocorrelation value falls below the autocorrelation threshold. In addition, the canceling output limiting unit may limit the increase in the canceling output when the number of times reaches the threshold number of times. This makes it possible to increase the reliability of the determination that the autocorrelation value of the target signal (error signal or reference or basic signal) is lower than the autocorrelation threshold.

The adaptive control circuit may obtain a voltage to be applied to a motor that drives a fan of an air conditioner of a vehicle in which the active vibration noise control apparatus is disposed. The adaptive control circuit may determine whether the applied voltage exceeds a voltage threshold. The adaptive control circuit may limit an increase in the filter coefficient regardless of whether the autocorrelation value exceeds the autocorrelation threshold, if the applied voltage exceeds the voltage threshold. Thus, when the air volume of the air conditioner becomes excessively large, it is possible to prevent divergence of control or occurrence of unintentional canceling sound by limiting an increase in filter coefficient.

An active vibratory noise control apparatus according to the present invention comprises a basic signal generating unit configured to output a basic signal indicating a target input which is a target noise or a target vibration; an adaptive control circuit configured to perform an adaptive control on the basic signal to output a control signal; an adaptive control circuit configured to perform an adaptive control on the basic signal to output a control signal; a canceling output generation unit configured to generate a canceling output as a canceling sound for the target noise or a canceling vibration for the target vibration based on the control signal; a first error detection unit configured to detect an error as a difference between the canceling output and the target input at a first evaluation point on a front seat side, and output a first error signal; a second error detection unit configured to detect an error as a difference between the canceling output and the target input at a second evaluation point on a rear seat side, and output a second error signal; wherein the adaptive control circuit comprises: an adaptive filter configured to generate the control signal on a basis of the basic signal or a reference signal based on the basic signal; a filter coefficient computing unit configured to calculate a filter coefficient of the adaptive filter based on the basic signal or the reference signal and the first error signal; a first-error-signal autocorrelation value calculation unit configured to calculate an autocorrelation value of the first error signal; a second-error-signal autocorrelation value calculation unit configured to calculate an autocorrelation value of the second error signal; and a canceling output limiting unit configured to limit an increase in the canceling output, and wherein the canceling output limiting unit limits the increase in the canceling output in a case where it is determined that the autocorrelation value of the first error signal is smaller than an autocorrelation threshold value for a front side and the autocorrelation value of the second error signal is greater than an autocorrelation threshold value for a rear side, and allows the increase in the canceling output in a case where it is determined that the autocorrelation value of the first error signal is smaller than the autocorrelation threshold value for the front side and the autocorrelation value of the second error signal is smaller than the autocorrelation threshold value for the rear side.

According to the present invention, in a case where it is determined that the autocorrelation value of the first error signal is smaller than the front side autocorrelation threshold value and the autocorrelation value of the second error signal is greater than the rear side autocorrelation threshold value, the increase in the canceling output is limited. As a result, when the influence of the disturbance entering the first error signal is large (for example, when the wind from the air conditioner has reached only the first evaluation point on the front seat side), it is possible to prevent divergence of control or occurrence of unintended canceling output by limiting the canceling output (canceling sound or canceling vibration).

Further, according to the present invention, when the autocorrelation value of the first error signal falls below the front side autocorrelation threshold value and the autocorrelation value of the second error signal falls below the rear side autocorrelation threshold value, the increase in the canceling output is allowed. Accordingly, when an event of lowering the autocorrelation value (for example, generation of road noise) occurs in both the first evaluation point on the front seat side and the second evaluation point on the rear seat side, increase in the canceling output is allowed. Therefore, when such an event occurs, it is possible to continue outputting the canceling output in order to raise the autocorrelation value on both the front seat side and the rear seat side.

An active vibration noise control circuit according to the present invention configured to receive a basic signal indicating a target input that is a target noise or a target vibration from a basic signal generating unit; generate a control signal indicating a canceling output as a canceling sound relative to the target noise or a canceling vibration relative to the target vibration by performing an adaptive control on the basic signal; and output the control signal to a canceling output generating unit configured to generate the canceling output, wherein the active vibration noise control circuit comprises: an adaptive filter configured to generate the control signal on a basis of the basic signal or the reference signal based on the basic signal; a filter coefficient computing unit configured to receive, from an error detection unit, an error signal indicative of an error as a difference between the canceling output and the target input at a certain evaluation point, and calculate a filter coefficient of the adaptive filter based on the reference or basic signal and at least one of the first error signal and the second error signal; a autocorrelation value calculation unit configured to calculate an autocorrelation value of the target signal as the error signal or the basic or reference signal; and a canceling output limiting unit configured to limit an increase in the canceling output in a case where it is determined that the autocorrelation value is lower than the cross correlation threshold value.

DESCRIPTION OF EMBODIMENTS

A. First Embodiment

<A-1. Configuration of First Embodiment>
[A-1-1. Overall Configuration]

Figure 1:
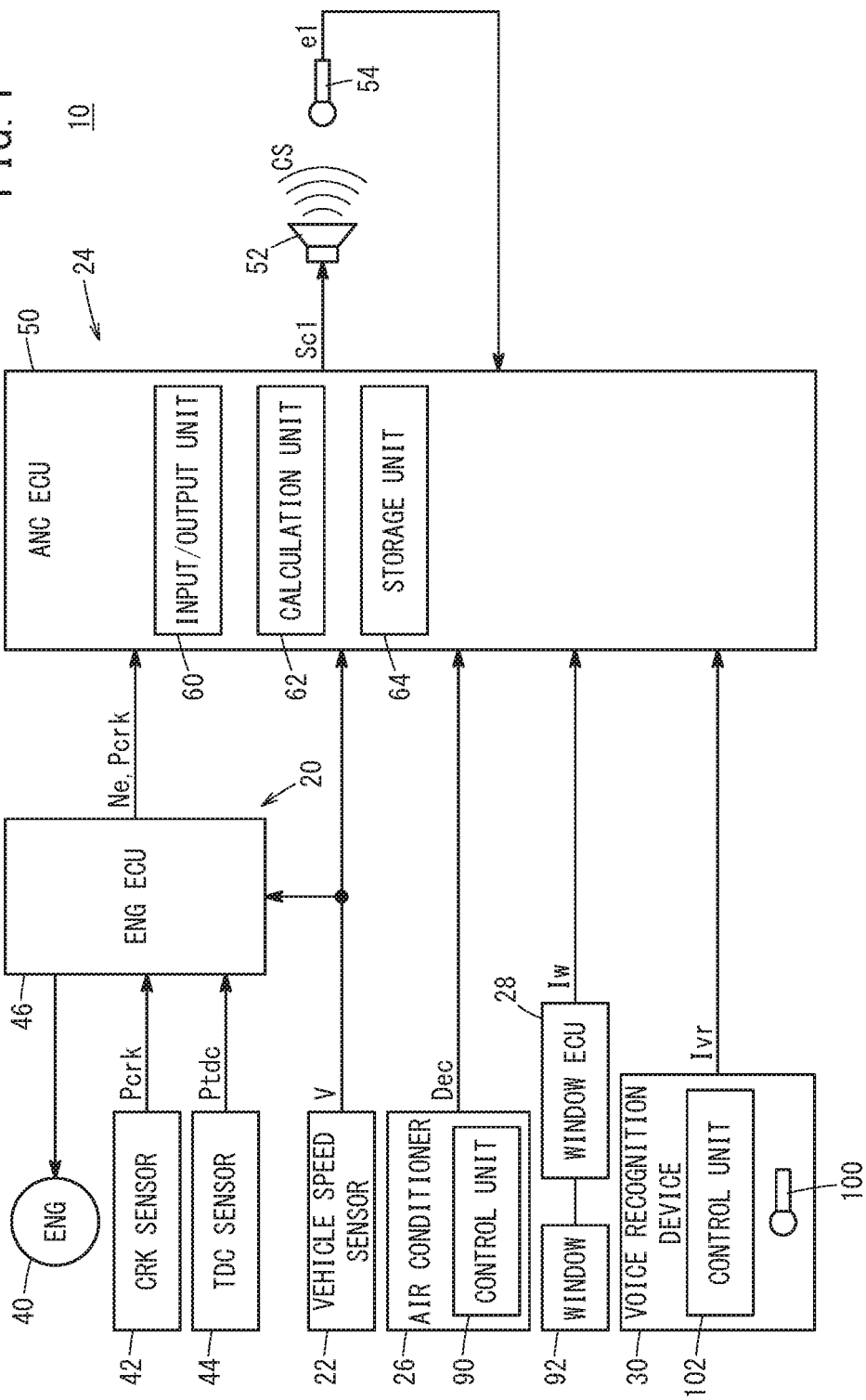
FIG. 1 is a diagram showing a schematic configuration of a vehicle equipped with an active noise control apparatus as an active vibration noise control apparatus according to a first embodiment of the present invention.

FIG. 1 shows an active noise control apparatus 24 (hereinafter referred to as "ANC apparatus 24") as an active vibration noise control apparatus according to a first embodiment of the present invention. FIG. 1 is a diagram showing a schematic configuration of a vehicle 10 on which a vehicle is mounted. The vehicle 10 includes, in addition to the ANC apparatus 24, an engine unit 20, a vehicle speed sensor 22, an air conditioner 26, a window electronic control unit 28 (hereinafter referred to as "window ECU 28"), and a voice recognition device 30.

[A-1-2. Engine Unit 20 and Vehicle Speed Sensor 22]

The engine unit 20 includes an engine 40, a crank pulse sensor 42 (hereinafter referred to as "CRK sensor 42"), a top dead center sensor 44 (hereinafter referred to as "TDC sensor 44"), an engine electronic control unit 46 (hereinafter referred to as "engine ECU 46" or "ENG ECU 46").

The CRK sensor 42 (basic signal generating unit) outputs to the engine ECU 46 a crank pulse Pcrk (hereinafter also referred to as "CRK pulse Pcrk") corresponding to the rotational angle of a crankshaft (not shown) of the engine 40. The TDC sensor 44 outputs to the engine ECU 46 a top dead center pulse Ptdc (hereinafter also referred to as "TDC pulse Ptdc") corresponding to the top dead center of each piston (not shown) of the engine 40.

If the output of the CRK sensor 42 and/or the TDC sensor 44 is analog, an analog/digital converter is provided between the CRK sensor 42 and the TDC sensor 44 and the engine ECU 46. As a result, digital values are input to the engine ECU 46.

The engine ECU 46 controls the output of the engine 40 based on the CRK pulse Pcrk, the TDC pulse Ptdc, the vehicle speed V, and the like. Further, the engine ECU 46 calculates the rotational speed Ne of the engine 40 per unit time (hereinafter also referred to as "rotational speed Ne") [Rpm] based on the CRK pulse Pcrk, and transmits it to the ANC apparatus 24. The vehicle speed sensor 22 detects the vehicle speed V of the vehicle 10 and outputs it to the engine ECU 46, the ANC apparatus 24, and the like.

[A-1-3. ANC Apparatus 24]
(A-1-3-1. Overview)

The ANC apparatus 24 outputs a canceling vibration CS with respect to a vibration noise VN (hereinafter also referred to as "noise VN") accompanying the operation of the engine 40, thereby canceling the noise VN at a certain evaluation point. The evaluation point here can be, for example, the driver's ear position or overhead. As shown in FIG. 1, the ANC apparatus 24 includes an active noise control electronic control unit 50 (hereinafter referred to as "ANC ECU 50").), a speaker 52, and a microphone 54.

(A-1-3-2. ANC ECU 50)
(A-1-3-2-1. Outline of ANC ECU 50)

The ANC ECU 50 (adaptive control circuit, active vibration noise control circuit) generates a control signal Sc1 by performing so-called adaptive control on a crank pulse Pcrk (engine signal). The synthesized control signal Sc1 indicates the canceling sound CS in accordance with the rotation of the engine 40. As shown in FIG. 1, the ANC ECU 50 includes an input/output unit 60, a computing unit 62, and a storage unit 64 as hardware. Except for the configuration peculiar to the present invention (a first autocorrelation value calculation unit 80a, a second autocorrelation value calculation unit 80b, the output switching unit 84 and the like which will be described later), the basic configuration of the ANC ECU 50 is the same as the configuration of the conventional ANC ECU (for example, those disclosed in JP 07-104767 A or US 2009/0060217 A1) can be used.

(A-1-3-2-2. Input/Output Unit 60)

The input/output unit 60 inputs and outputs signals between the ANC ECU 50 and external devices (the vehicle speed sensor 22, the air conditioner 26, etc.).

(A-1-3-2-3. Computing Unit 62)
(A-1-3-2-3-1. Outline of Computing Unit 62)

The computing unit 62 includes a central processing unit (CPU) (not shown) and controls the entire ANC apparatus 24 by executing a program stored in the storage unit 64. A part of the program may be replaced with an electric circuit or an electronic circuit as hardware.

Figure 2:
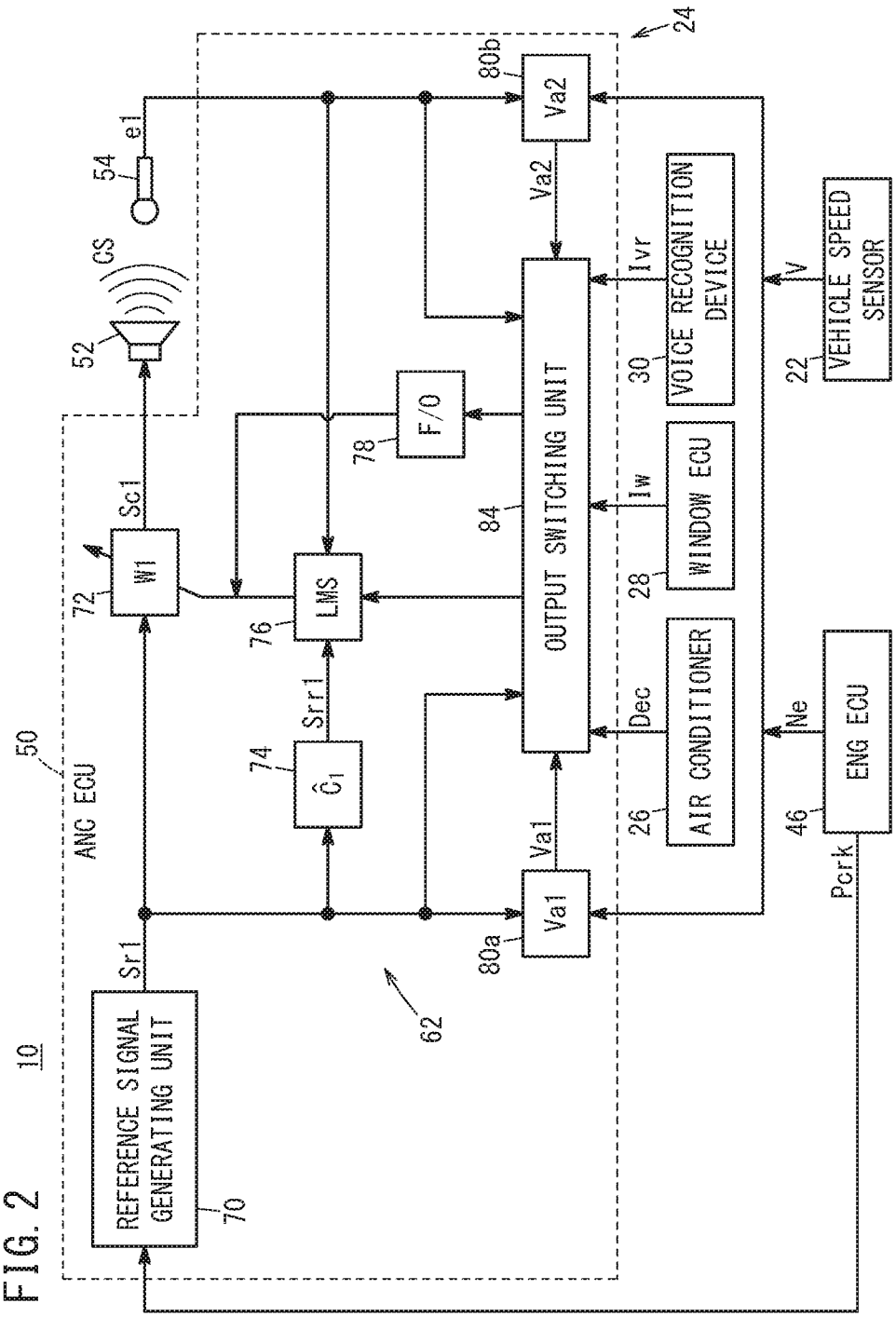
FIG. 2 is a block diagram showing a computing unit and its periphery of an electronic control unit of the active noise control in the first embodiment.

FIG. 2 is a block diagram showing the computing unit 62 and the periphery of the ANC ECU 50 according to the first embodiment. As shown in FIG. 2, the computing unit 62 includes a reference signal generation unit 70, adaptive filter 72, a reference signal correcting unit 74, a filter coefficient computing unit 76, and a fade-out processing unit 78, a first autocorrelation value calculation unit 80a, a second value calculation unit 80b and an output switching unit 84.

(A-1-3-2-3-2. Reference Signal Generating Unit 70)

The reference signal generating unit 70 generates the reference signal Sr1 based on the CRK pulse Pcrk as the reference signal, and outputs it to the adaptive filter 72, the reference signal correcting unit 74, the first autocorrelation value calculation unit 80a and the output switching unit 84.

(A-1-3-2-3-3. Adaptive Filter 72)
filter coefficient computing unit fade-out processing unit 78
The adaptive filter 72 is, for example, a FIR (Finite Impulse Response) type or adaptive notch type filter. The adaptive filter 72 performs adaptive filter processing using the filter coefficient W1 on the reference signal Sr1 and outputs the control signal Sc1. As described above, the control signal Sc1 represents a canceling sound CS.

(A-1-3-2-3-4. Reference Signal Correcting Unit 74)

The reference signal correcting unit 74 generates a correction reference signal Srr1 by performing a transfer function process on the reference signal Sr1. The correction reference signal Srr1 is used in calculating the filter coefficient W1 in the filter coefficient computing unit 76 (filter coefficient calculation unit). The transfer function process is a process of correcting the reference signal Sr1 based on the transfer function $Ce_1$ (filter coefficient) of the canceling sound CS from the speaker 52 to the microphone 54. The transfer function $Ce_1$ used in this transfer function processing is a measured value or predicted value ($C_1\hat{}$) of the actual transfer function $C_1$ of the canceling sound CS from the speaker 52 to the microphone 54.

(A-1-3-2-3-5. Filter Coefficient Computing Unit 76)

A filter coefficient computing unit 76 (hereinafter also referred to as "computing unit 76") sequentially calculates and updates the filter coefficient W1. The computing unit 76 computes the filter coefficient W1 by using an adaptive algorithm operation {for example, least squares method (LMS) algorithm operation}. In other words, based on the correction reference signal Srr1 from the reference signal correcting unit 74 and the error signal e1 from the microphone 54, the computing unit 76 computes the filter coefficient W1 so that the square (e1)² of the error signal e1 is zero. A specific calculation in the filter coefficient computing unit 76 can be performed in the same manner as in JP 07-104767 A or US 2009/0060217 A1, for example.

(A-1-3-2-3-6. Fade-Out Processing Unit 78)

The fade-out processing unit 78 performs fade-out processing based on a command from the output switching unit 84. The fade-out process is a process of gradually decreasing the filter coefficient W1 of the adaptive filter 72 and stopping the output of the canceling sound CS.

(A-1-3-2-3-7. First Autocorrelation Value Calculation Unit 80a and Second Autocorrelation Value Calculation Unit 80b)

The first autocorrelation value calculation unit 80a (hereinafter also referred to as "calculation unit 80a") calculates the autocorrelation value Va1 of the reference signal Sr1 (hereinafter also referred to as "first autocorrelation value Va1") and outputs it to the output switching unit 84. Calculation of the first autocorrelation value Va1 is performed using the following equation (1).

$$Va1(t) = \lim_{T \to n} \frac{1}{T} \int_0^T Ac1(t)dt \quad (1)$$

In the equation (1), T represents the sampling number, and n represents a specific natural number (for example, any one of 10 to 1000). Alternatively, instead of equation (1), equation (7) to be described later may be used. The value Ac1 is defined by the following equation (2).

$$Ac1(t)=fsm1(t-\tau) \times fsm1(t) \quad (2)$$

In the equation (2), fsm1 is the frequency [Hz] of the reference signal Sr1. Also, t indicates a certain point in time, and τ represents a time lag from the time t In other words, fsm1(t) is the frequency of the reference signal Sr1 at time t, and fsm1(t−τ) is the frequency of the reference signal Sr1 at time t−τ. For example, from the viewpoint that the product of the previous value and the current value of the frequency of the reference signal Sr1 is Ac1, the equation (2) may be modified as the equation (3).

$$Ac1(t)=fsm1(t) \times fsm1(t+\tau) \quad (3)$$

The second autocorrelation value calculation unit 80b (hereinafter also referred to as "calculation unit 80b") calculates the autocorrelation value Va2 (hereinafter also referred to as "second autocorrelation value Va2") of the error signal e1, outputs it to the output switching unit 84. Similar to the calculation of the first autocorrelation value Va1, the calculation of the second autocorrelation value Va2 is performed using the following equation (4).

$$Va2(t) = \lim_{T \to n} \frac{1}{T} \int_0^T Ac2(t)dt \quad (4)$$

In the equation (4), the value Ac2 is defined by the following equation (5).

$$Ac2(t)=fsm2(t) \times fsm2(t+\tau) \quad (5)$$

In the equation (5), fsm2 is the frequency [Hz] of the error signal e1. Also, t indicates a certain time point, and τ indicates a time difference from t. In other words, fsm2(t) is the frequency of error signal e1 at time t and fsm2(t+τ) is the frequency of error signal e2 at time t+τ. From the viewpoint that Ac2 is the product of the previous value and the current value of the frequency of the error signal e1, Expression (5) may be modified as in equation (6), for example.

$$Ac2(t+\tau)=fsm2(t) \times fsm2(t+\tau) \quad (6)$$

Further details regarding the calculation of the first autocorrelation value Va1 and the second autocorrelation value Va2 will be described later with reference to FIG. 3

(A-1-3-2-3-8. Output Switching Unit 84)

The output switching unit 84 (canceling output limiting unit) switches the output of the canceling sound CS based on various kinds of information. The information here includes the first autocorrelation value Va1, the second autocorrelation value Va2, information of the reference signal Sr1 (difference ΔVef1 between the amplitude AS1 and the effective value Vef1), information of the error signal e1 (difference ΔVef2 between the amplitude AS2 and the effective value Vef2), the air volume Dec of the air conditioner 26, the opening and closing state of the window 92, and the operation state of the voice recognition device 30. Details of the operation of the output switching unit 84 will be described later with reference to FIG. 4.

(A-1-3-2-4. Storage Unit 64)

The storage unit 64 has a nonvolatile memory and a volatile memory, and stores programs and data used by the computing unit 62.

(A-1-3-3. Speaker 52)

The speaker 52 (canceling output generating unit) outputs a canceling sound CS corresponding to the control signal Sc1 from the ANC apparatus 24. As a result, a silencing effect of the vibration noise VN (engine noise) as an input to be canceled is obtained. Although only one speaker 52 is shown in FIGS. 1 and 2, this is for the purpose of facilitating understanding of the invention, and it is also possible to use a plurality of speakers 52 according to the use of the ANC apparatus 24. In that case, the number of other constituent elements may be appropriately changed. The same applies to the microphone 54.

(A-1-3-4. Microphone 54)

The microphone 54 (error detection unit) detect an error of a difference between the canceling sound CS and the vibration noise VN (engine noise) as a residual noise, and outputs an error signal e1 indicating the residual noise to the ANC apparatus 24.

[A-1-4. Air Conditioner 26]

The air conditioner 26 controls (cools or warms) the air in response to the operation by an occupant (including a driver) of the vehicle 10. The air conditioner 26 has a control unit 90 (FIG. 1) for controlling the air condition. The control unit 90 notifies the output switching unit 84 of the ANC ECU 50 of the air volume Dec [%] of the air conditioner 26.

In addition, the control unit 90 of the air conditioner 26 may include an automatic air blowing control unit (not shown) for automatically controlling the amount of the air blown by the air conditioner 26 so as to enable proper blowing regardless of the occupant's operation.

[A-1-5. Window ECU 28]

The window ECU 28 controls the opening and closing of the window 92 in response to the operation by the occupant (including the driver) of the vehicle 10. The window ECU 28 transmits the window information Iw indicating the opening/closing state of the window 92 to the output switching unit 84 of the ANC ECU 50.

[A-1-6. Voice Recognition Device 30]

The voice recognition device 30 recognizes a voice of an occupant (including a driver). The voice recognized by the voice recognition device 30 is used in a navigation device or the like (not shown). The voice recognition device 30 has a microphone 100 and a control unit 102. The microphone 100 may be common to the microphone 54. The voice recognition device 30 transmits the voice recognition information Ivr indicating its own operating state (whether voice recognition is in progress) to the output switching unit 84 of the ANC ECU 50.

<A-2. Various Controls of the First Embodiment>

[A-2-1. Autocorrelation Value Calculation Control]

Figure 3:
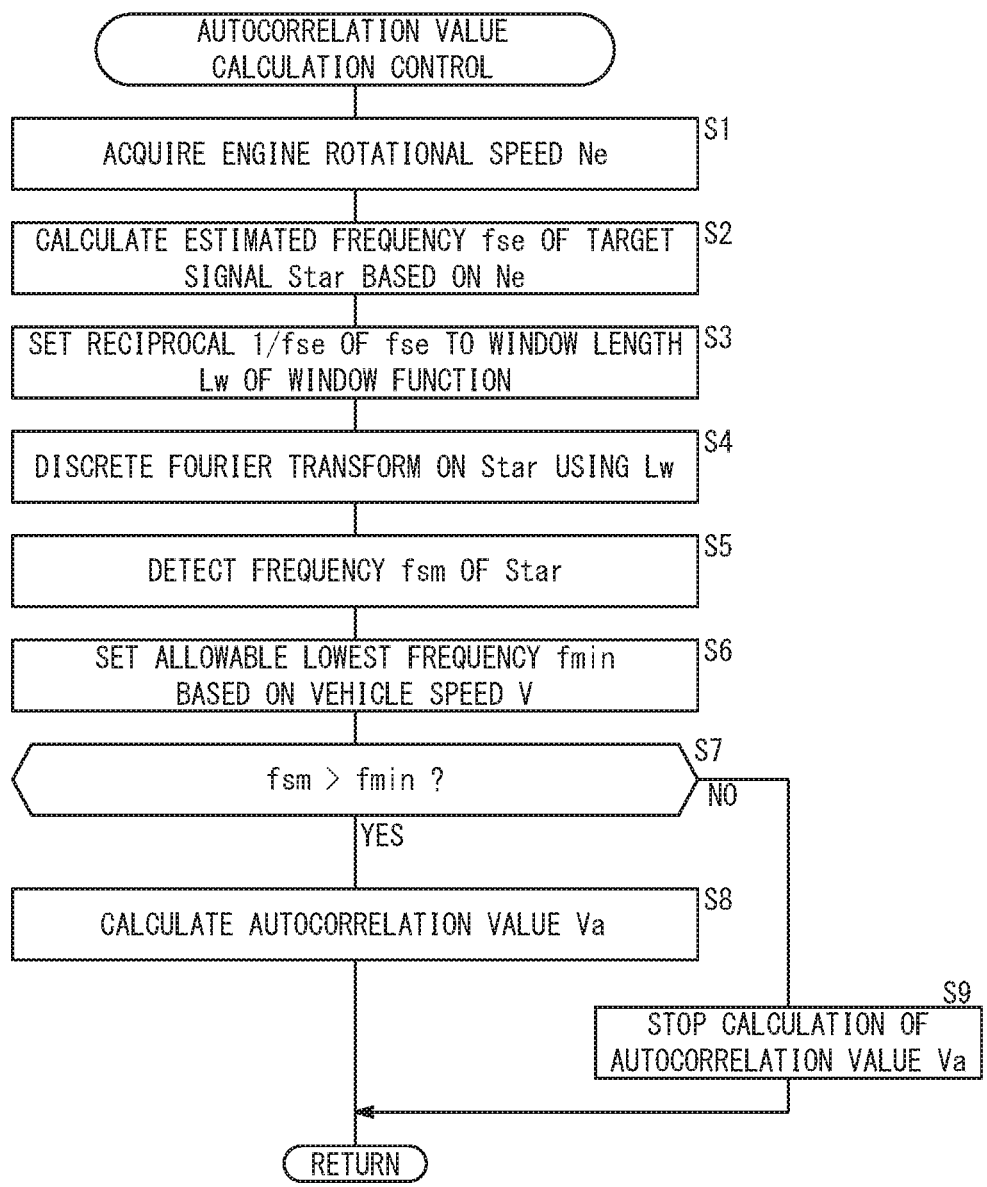
FIG. 3 is a flowchart of autocorrelation value calculation control according to the first embodiment.

FIG. 3 is a flowchart of an autocorrelation value calculation control according to the first embodiment. The autocorrelation value calculation control is a control to calculate the autocorrelation value Va of the target signal Star. The target signal Star is a signal of calculation target of an autocorrelation value Va. When calculating the first autocorrelation value Va1, the target signal Star is the reference signal Sr1, and when calculating the second autocorrelation value Va2, the target signal Star is the error signal e1.

The autocorrelation value calculation control when calculating the first autocorrelation value Va1 is executed by the first autocorrelation value calculation unit 80a. The autocorrelation value calculation control when calculating the second autocorrelation value Va2 is executed by the second autocorrelation value calculation unit 80b. The process of FIG. 3 is executed every predetermined calculation cycle. Hereinafter, the first autocorrelation value calculation unit 80a and the second autocorrelation value calculation unit 80b are collectively referred to as the autocorrelation value calculation unit 80 or the calculation unit 80.

In step S1 of FIG. 3, the autocorrelation value calculation unit 80 acquires the engine rotational speed Ne per unit time (engine rotational speed Ne) [rpm] from the engine ECU 46. In step S2, the calculation unit 80 calculates the estimated frequency fse (hereinafter also referred to as "estimated frequency fse") [Hz] of the frequency fsm of the target signal Star based on the engine speed Ne. As the engine speed Ne increases, the estimated frequency fse increases. In step S3, the calculation unit 80 calculates the reciprocal 1/fse of the estimated frequency fse, and sets the reciprocal 1/fse as the window length Lw of the window function WF.

In step S4, the autocorrelation value calculation unit 80 performs the discrete Fourier transform on the target signal Star. At this time, the calculation unit 80 uses the window length Lw of the window function WF set in step S3. In step S5, the calculation unit 80 detects the frequency fsm of the target signal Star subjected to the discrete Fourier transform. Hereinafter, the frequency fsm are also referred to as detected frequency fsm.

In step S6, the calculation unit 80 sets the allowable lowest frequency fmin based on the vehicle speed V. The allowable lowest frequency fmin is the lowest value of the frequency fsm that allows calculation of the autocorrelation value Va. For example, the calculation unit 80 sets the allowable lowest frequency fmin higher as the vehicle speed V becomes higher.

In step S7, the calculation unit 80 determines whether or not each of the detected frequency fsm in step S5 exceeds the allowable lowest frequency fmin. When the detected frequency fsm are higher than the allowable lowest frequency fmin (S7: YES), the autocorrelation value Va calculated from the detected frequency fsm can be said to be relatively reliable. Therefore, in step S8, the calculation unit 80 calculates the autocorrelation value Va based on the n detected frequency fsm including the current value. As described above, the autocorrelation value Va is calculated using the above equation (1) or (4). The calculation unit 80 transmits the calculated autocorrelation value Va to the output switching unit 84.

Regarding the calculation of the first autocorrelation value Va1 (equations (1) and (2)), when the frequency fsm1 of the reference signal Sr1 is periodic, there is a correlation between the frequency fsm1($t-\tau$) and the frequency fsm1($t$). In this case, the autocorrelation value Va (equation (1)) as a time average of the product of the frequency fsm1($t-\tau$) and the frequency fsm1($t$) is a value away from zero. On the other hand, when random (or disordered) signals (that is, disturbances) are generated, the product of the frequency fsm1($t-\tau$) and the frequency fsm1($t$) is randomly a positive or negative value around zero. In this case, the first autocorrelation value Va1 (expression (1)) as the time average of the product of the frequency fsm1($t-\tau$) and the frequency fsm1($t$) is a value approaching zero. Therefore, based on the first autocorrelation value Va1, occurrence of a disturbance can be detected or estimated. The same applies to the second autocorrelation value Va2.

Returning to step S7 in FIG. 3, if the detection frequency fsm does not exceed the allowable lowest frequency fmin (S7: NO), the autocorrelation value Va calculated from the detected frequency fsm may be a value with a relatively low reliability. Therefore, in step S9, the calculation unit 80 stops calculating the autocorrelation value Va. In this case, the calculation unit 80 may output a fixed value close to zero or zero as the autocorrelation value Va.

[A-2-2. Canceling Sound Output Switching Control]

Figure 4:
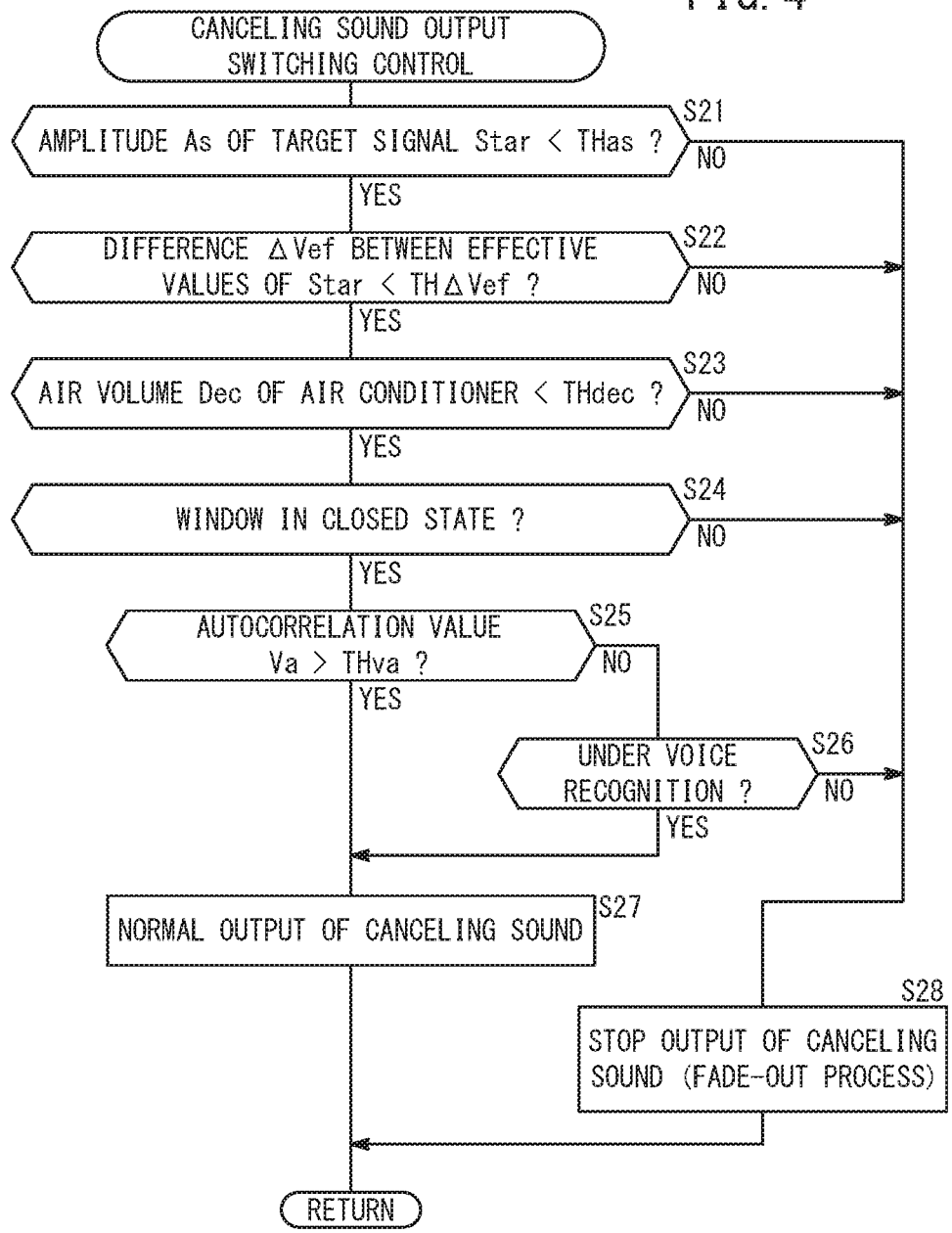
FIG. 4 is a flowchart of canceling sound output switching control according to the first embodiment.

FIG. 4 is a flowchart of the canceling sound output switching control according to the first embodiment. The canceling sound output switching control is control for switching the output of the canceling sound CS, and is executed by the output switching unit 84. The process of FIG. 4 is executed at every predetermined calculation cycle.

In step S21 of FIG. 4, the output switching unit 84 determines whether or not the amplitude As [V] of the target signal Star are lower than the amplitude threshold value THas. Specifically, in the case where the target signal Star is the reference signal Sr1, the output switching unit 84 determines whether or not the amplitude As of the reference signal Sr1 (hereinafter also referred to as "amplitude As1") is smaller than an amplitude threshold value THas (also referred to as "amplitude threshold value THas1" hereinafter). In the case where the target signal Star is the error signal e1, the output switching unit 84 determines whether or not the amplitude As of the error signal e1 (hereinafter also referred to as "amplitude As2") is smaller than an amplitude threshold value THas (also referred to as "amplitude threshold value THas2" hereinafter).

The amplitude threshold value THas is a threshold value for determining whether or not the amplitude As of the target signal Star is small enough to output the canceling sound CS. In other words, in the case where the amplitude As exceeds the amplitude threshold value THas, the amplitude As is too large to sufficiently exhibit the silencing effect by the canceling sound CS. When the amplitude As is lower than the amplitude threshold value THas (S21: YES), the process proceeds to step S22.

In step S22, the output switching unit 84 determines whether or not the difference ΔVef [V] of the effective values Vef of the target signals Star is lower than the difference threshold value THΔVef. Here, the difference ΔVef is the difference between the previous value and the current value. Specifically, in the case where the target signal Star is the reference signal Sr1, the output switching unit 84 calculates the difference ΔVef (also referred to as "difference ΔVef1" hereinafter) of the effective value Vef of the reference signal Sr1 (also referred to as "effective value Vef1" hereinafter) based on the reference signal Sr1. Then, the output switching unit 84 determines whether or not the difference ΔVef1 is smaller than the difference threshold THΔVef (also referred to as "difference threshold THΔVef1" hereinafter).

In the case where the target signal Star is the error signal e1, the output switching unit 84 calculates the difference ΔVef (also referred to as "difference ΔVef2" hereinafter) of the effective value Vef of the error signal e1 (also referred to as "effective value Vef2" hereinafter). Then, the output switching unit 84 determines whether or not the difference ΔVef2 is smaller than the difference threshold THΔVef (also referred to as "difference threshold THΔVef2" hereinafter).

The difference threshold value THΔVef is a threshold value for determining whether or not the difference ΔVef is small enough to output the canceling sound CS. In other words, when the difference ΔVef exceeds the difference threshold value THΔVef, the change in the target signal Star is too large to sufficiently exhibit the silencing effect by the canceling sound CS. In the case where the difference ΔVef is lower than the difference threshold value THΔVef (S22: YES), the process proceeds to step S23.

In step S23, the output switching unit 84 determines whether or not the air volume Dec of the air conditioner 26 falls below the air volume threshold value THdec. The air volume threshold value THdec is a threshold value for determining whether the air volume Dec is small enough to output the canceling sound CS. In other words, when the air flow Dec exceeds the air volume threshold value THdec, the output sound of the air conditioner 26 is too large sufficiently exhibit the silencing effect by the canceling sound CS. When the air flow Dec is lower than the air volume threshold value THdec (S23: YES), the process proceeds to step S24.

In step S24, the output switching unit 84 determines whether the window 92 is in the closed state (in other words, whether the window 92 is not in the open state). This determination is made based on the window information Iw from the window ECU 28. When the window 92 is in the closed state (S24: YES), the process proceeds to step S25.

In step S25, the output switching unit 84 determines whether or not the autocorrelation value Va exceeds the autocorrelation threshold value THva (hereinafter also referred to as "correlation threshold value THva"). Specifically, in the case where the target signal Star is the reference signal Sr1, the output switching unit 84 determines whether or not the first autocorrelation value Va1 of the reference signal Sr1 exceeds the correlation threshold value THva (hereinafter also referred to as "first autocorrelation threshold value THva1"). In the case where the target signal Star is the error signal e1, the output switching unit 84 determines whether or not the second autocorrelation value Va2 of the error signal e1 exceeds the correlation threshold value THva (hereinafter also referred to as "second autocorrelation threshold value THva2").

The correlation threshold value THva is a threshold value for determining whether or not the autocorrelation value Va is larger enough to output the canceling sound CS. In other words, when the autocorrelation value Va is lower than the correlation threshold value THva, there is a high possibility that a disturbance has entered the target signal Star, so that the silencing effect by the canceling sound CS will not be sufficiently exhibited. When the autocorrelation value Va exceeds the correlation threshold value THva (S25: YES), the process proceeds to step S27. When the autocorrelation value Va does not exceed the correlation threshold value THva (S25: NO), the process proceeds to step S26.

In step S26, the output switching unit 84 determines whether or not the voice recognition device 30 is performing voice recognition. This determination is made based on the voice recognition information Ivr from the voice recognition device 30. In the case where voice recognition is in progress (S26: YES), the disturbance caused in the target signal Star may be due to the occupant's utterance. In this case, the process proceeds to step S27.

If step S25: YES or S26: YES, in step S27, the output switching unit 84 performs normal output of canceling sound CS. When any one of the steps S21 to S24 and S26 is NO, the output switching unit 84 stops the output of the canceling sound CS in the step S28. At that time, the output switching unit 84 causes the fade-out processing unit 78 to execute the fade-out processing to fade out the canceling sound CS.

The fade-out process here is, for example, a process of gradually decreasing the filter coefficient W1 by repeatedly multiplying the present filter coefficient W1 by a value larger than 0 and smaller than 1 (for example, 0.95).

<A-3. Effect of the First Embodiment

According to the first embodiment as described above, when it is determined that the autocorrelation value Va (Va1, Va2) of the target signal Star (the error signal e1 and the reference signal Sr1) is lower than the autocorrelation threshold value THva (THva1, THva2) (S25: NO in FIG. 4), the increase of the canceling sound CS (canceling output) is limited (S28). Thus, when the influence of the disturbance entering the error signal e1 or the reference signal Sr1 or a crank pulse Pcrk (basic signal) is large, it becomes possible to prevent the divergence of the control or the occurrence of the unintended canceling sound CS by restricting the increase of the canceling sound CS.

In the first embodiment, when the frequency fsm of the target signal Star is higher than the allowable lowest frequency fmin (S7: YES in FIG. 3), the autocorrelation value calculation units 80a, 80b (FIG. 2) calculate the correlation value Va of the target signal Star (S8). If the frequency fsm of the target signal Star does not exceed the allowable lowest frequency fmin (S7: NO), the calculation units 80a, 80b does not calculate the autocorrelation value Va of the target signal Star (S9).

When the frequency fsm of the target signal Star is relatively low, the variation of the autocorrelation value Va tends to be large. Therefore, when the frequency fsm of the target signal Star is relatively low, it is not possible to limit the increase in the canceling sound CS (S28 in FIG. 4) at an appropriate scene by not calculating the autocorrelation value Va.

In the first embodiment, the autocorrelation value calculation units 80a, 80b acquire the vehicle speed V of the vehicle 10 where the ANC apparatus 24 (active vibration noise control apparatus) is disposed, and switches the allowable lowest frequency fmin according to the vehicle speed V (S6 in FIG. 3). Thus, by switching the utilization of the autocorrelation value Va according to the vehicle speed V, it is possible to suppress the increase of the filter coefficient W1 (S28 of FIG. 4) at an appropriate scene.

In the first embodiment, the ANC ECU 50 (adaptive control circuit) determines whether or not the amplitude As of the target signal Star exceeds the amplitude threshold value THas (S21 in FIG. 4). In the case where the amplitude AS of the target signal Star exceeds the amplitude threshold value THas (S21: NO), the ANC ECU 50 limits the increase of W1 regardless of whether or not the autocorrelation value Va exceeds the autocorrelation threshold value THva (S25) (S28).

As a result, when the amplitude As of the target signal Star becomes excessively large, the increase in the filter coefficient W1 is limited (S28) to prevent the divergence of control or the occurrence of an unintended canceling sound CS.

In the first embodiment, the ANC ECU 50 (adaptive control circuit) calculates the difference ΔVef of the effective value Vef with respect to the previous value and the current value of the target signal Star, and determines whether or not the difference ΔVef exceeds the difference threshold value THΔVef of the effective value Vef (S22 in FIG. 4). When the difference ΔVef of the effective value Vef exceeds the difference threshold value THΔVef (S22: NO), the ANC ECU 50 limits the increase in the filter coefficient W1 (S28) regardless of whether the autocorrelation value Va exceeds the autocorrelation threshold value THva (S25). As a result, when the difference ΔVef of the effective value Vef of the target signal Star becomes excessively large, divergence of control or unintentional canceling sound CS can be prevent from occurring by limiting the increase of the filter coefficient W1.

In the first embodiment, the ANC ECU 50 (adaptive control circuit) acquires the air volume Dec of the air conditioner 26 of the vehicle 10 where the ANC apparatus 24 (active vibration noise control apparatus) is disposed, and determines whether or not the air volume Dec exceeds the air volume threshold value THdec (S23 in FIG. 4). If the air volume Dec exceeds the air volume threshold value THdec (S23: NO), the ANC ECU 50 limits the increase of the filter coefficient W1 (S28) regardless of whether or not the autocorrelation value Va exceeds the autocorrelation threshold value THva (S25).

As a result, when the air volume Dec of the air conditioner 26 becomes excessively large, it is possible to prevent divergence of control or occurrence of unintended canceling sound CS by limiting the increase of the filter coefficient W1 (S28).

In the first embodiment, the ANC ECU 50 (adaptive control circuit) specifies whether or not the window 92 of the vehicle 10 where the ANC apparatus 24 (active vibration noise control apparatus) is placed is in the open state S24 in FIG. 4). If the window 92 is in the open state (S24: NO), the ANC ECU 50 limits the increase in the filter coefficient W1 (S28) regardless of whether or not the autocorrelation value Va exceeds the autocorrelation threshold value THva (S25).

As a result, when the window 92 of the vehicle 10 is in the open state, it is possible to prevent divergence of control or occurrence of unintended canceling sound CS by limiting the increase of the filter coefficient W1 (S28).

In the first embodiment, the autocorrelation value calculation unit 80 sets the window length Lw of the window function WF that specifies the extraction portion for calculating the autocorrelation value Va out of the target signal Star (S3 in FIG. 3). Then, the calculation unit 80 calculates the autocorrelation value Va for the extracted portion specified by using the window length Lw (S4). Further, the calculation unit 80 acquires the rotational speed Ne of the engine 40 (running drive source) of the vehicle 10 (S1), and changes the window length Lw of the window function WF according to the rotational speed Ne (S2, S3).

Thus, the range of the extraction portion of the target signal Star used for calculating the autocorrelation value Va is changed in accordance with the rotational speed Ne of the engine 40. When the rotational speed Ne is high, the main components of the target signal Star are high-frequency components. In this case, for example, by shortening the window length Lw of the window function WF, it is possible to shorten the calculation cycle of the autocorrelation value Va or to improve the detection accuracy of the autocorrelation value Va (because the influence of the low frequency component decreases).

In the first embodiment, the autocorrelation value calculation unit 80 estimates the frequency fse of the target signal Star (S2 in FIG. 3) based on the rotational speed Ne of the engine 40 (running drive source) (S2 in FIG. 3), and sets the reciprocal 1/fse of the estimated frequency fse to the window length Lw of the window function WF (S3). This makes it possible to set the window length Lw of the window function WF by a relatively simple method.

In the first embodiment, the target signal Star contains the error signal e1 (FIG. 2). The ANC ECU 50 (adaptive control circuit) specifies whether or not the voice recognition device 30 is performing voice recognition (S26 in FIG. 4). When the voice recognition device 30 is performing voice recognition (S26: YES), regardless of whether the autocorrelation value Va falls below the autocorrelation threshold value THva (S25), the increase of the filter coefficient W1 is permitted (S27).

As a result, even when a disturbance occurs in the error signal e1 (target signal Star) with voice input to the microphone 54, the generation of the canceling sound CS (canceling output) is continued. Therefore, by limiting the increase of the canceling sound CS at the time of voice recognition (S28), it is possible to prevent the voice recognition from becoming rather difficult.

B. Second Embodiment

<B-1. Configuration of Second Embodiment (Difference from First Embodiment)>
[B-1-1. Overall Configuration]

Figure 5:
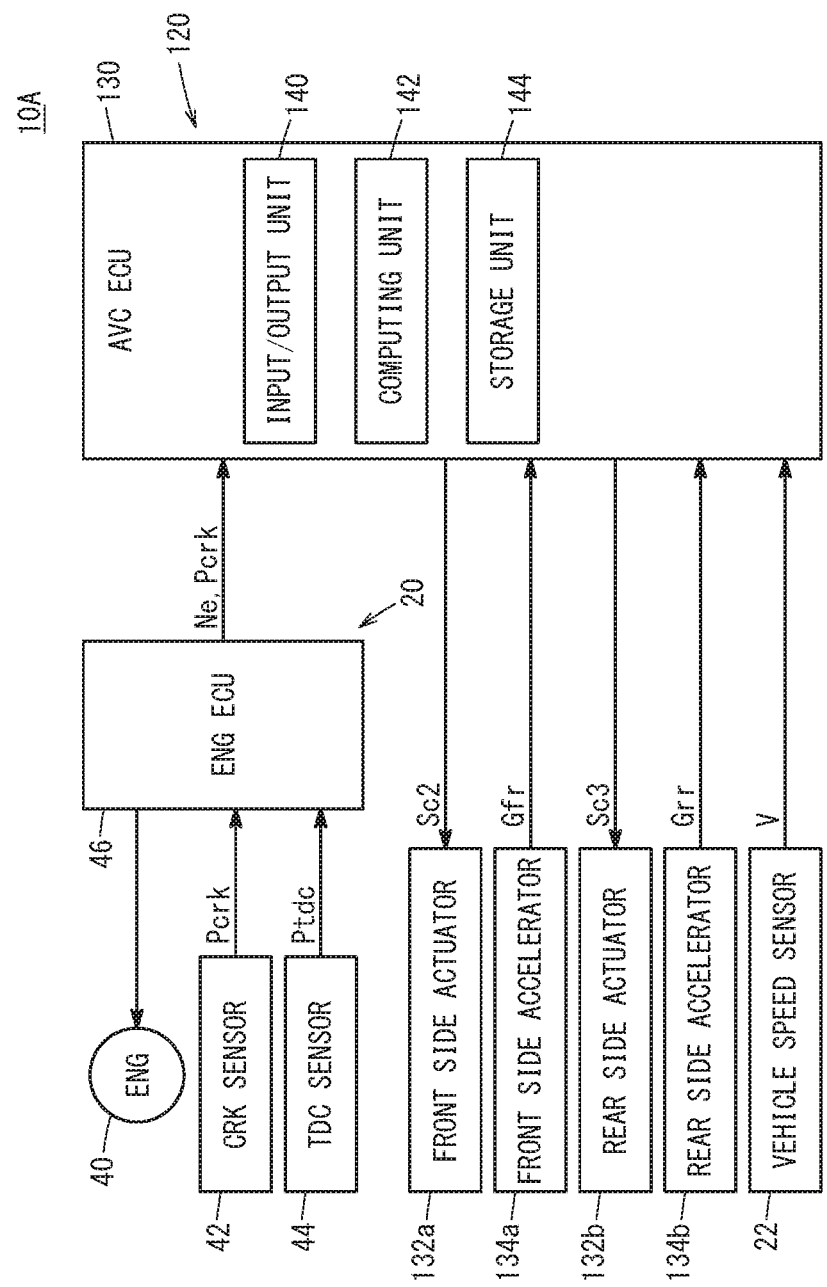
FIG. 5 is a diagram showing a schematic configuration of a vehicle equipped with an active noise control apparatus as an active vibration noise control apparatus according to a second embodiment of the present invention.

FIG. 5 shows a schematic configuration of a vehicle 10A on which an active vibration control apparatus 120 (hereinafter referred to as "AVC apparatus 120") as an active vibration noise control apparatus according to a second embodiment of the present invention is mounted. The vehicle 10A includes an engine unit 20 and a vehicle speed sensor 22 in addition to the AVC apparatus 120. Constituent elements similar to those of the first embodiment are denoted by the same reference numerals, and a detailed description thereof will be omitted.

In the first embodiment, the vibration noise VN (target noise) is reduced by outputting a canceling sound CS (canceling output) from the speaker 52 (FIG. 1). In contrast, in the second embodiment, by outputting canceling vibration CV (canceling output) from the AVC apparatus 120, the engine vibration EV (target vibration) transmitted from the engine 40 to the subframe (not shown) is reduced.

[B-1-2. AVC Apparatus 120]

(B-1-2-1. Overview)

The AVC apparatus 120 cancels the engine vibration EV at a specific evaluation point by outputting canceling vibration CV to the vibration EV generated by the engine 40. The evaluation point here can be, for example, the positions of the acceleration sensors 134a, 134b which will be described later. The AVC apparatus 120 is a so-called active control mount (ACM). As shown in FIG. 5, the AVC apparatus 120 includes an active vibration control electronic control unit 130 (hereinafter referred to as "AVC ECU 130"), actuators 132a, 132b, acceleration sensors 134a, 134b.

(B-1-2-2. AVC ECU 130)

(B-1-2-2-1. Overview of the AVC ECU 130)

The AVC ECU 130 (adaptive control circuit, active vibration noise control circuit) generates control signals Sc2, Sc3 by performing so-called adaptive control on the crank pulse Pcrk (engine signal). The control signals Sc2, Sc3 indicate canceling vibrations CV corresponding to the rotation of the engine 40. As shown in FIG. 5, the AVC ECU 130 includes an input/output unit 140, a calculation unit 142, and a storage unit 144 as hardware. Except for configurations peculiar to the present invention (the first autocorrelation value calculation units 160a, 160b, the second autocorrelation value calculation units 160c, 160d, the output switching units 162a, 162b, etc.), the same configuration as in the conventional AVC ECU (for example, US 2012/0032619 A1) is usable as the basic configuration of the AVC ECU 130.

(B-1-2-2-2. Input/Output Unit 140)

The input/output unit 140 inputs and outputs signals between the AVC ECU 130 and external devices (the vehicle speed sensor 22, the ENG ECU 46, etc.).

(B-1-2-2-3. Calculation Unit 142)

(B-1-2-2-3-1. Outline of Calculation Unit 142)

The calculation unit 142 includes a central processing unit (CPU) (not shown) and controls the entire AVC apparatus 120 by executing a program stored in the storage unit 144. A part of the program may be replaced with an electric circuit or an electronic circuit as hardware.

Figure 6:
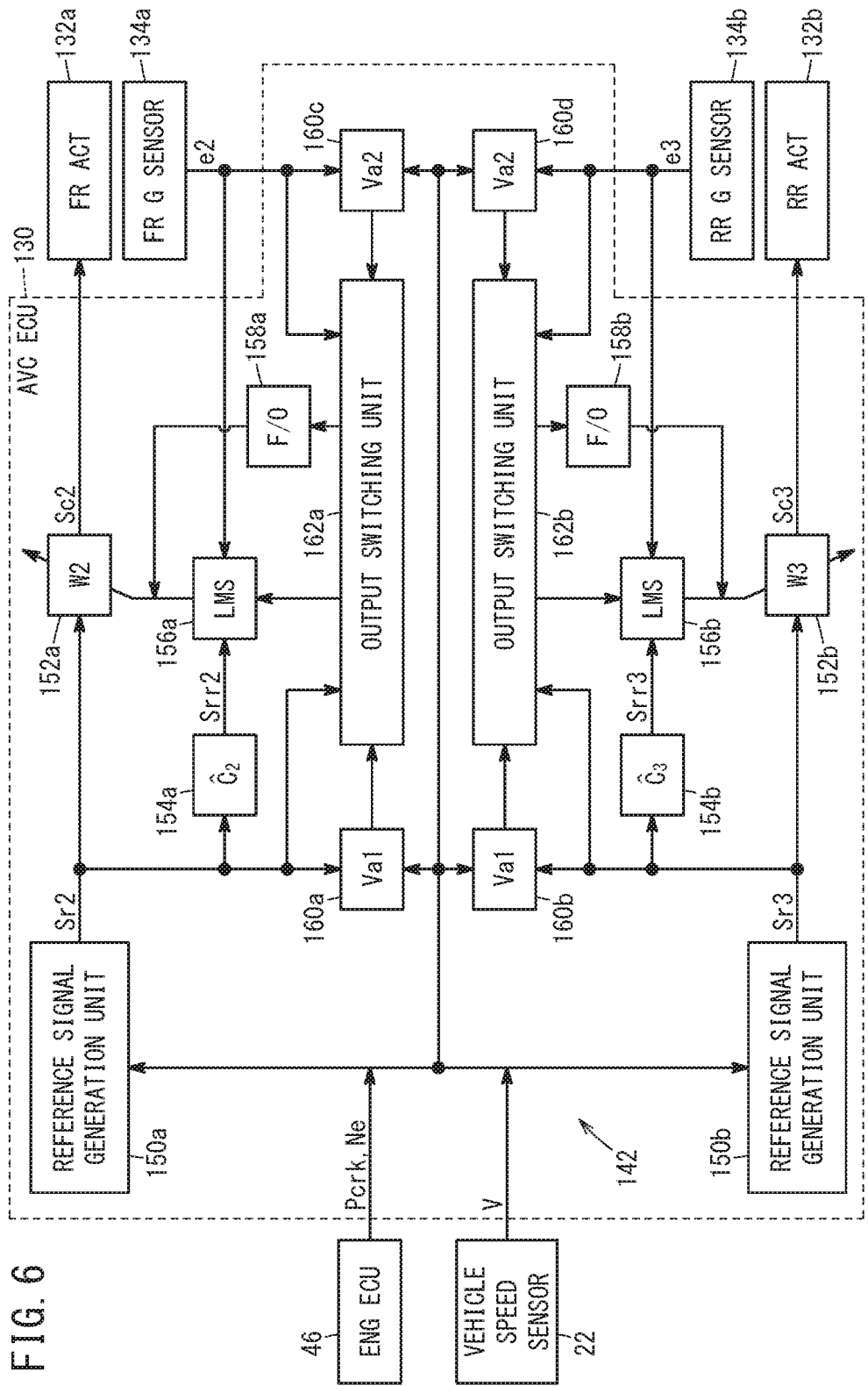
FIG. 6 is a block diagram showing a computing unit and its periphery of an electronic control unit of the active vibration control in the second embodiment.

FIG. 6 is a block diagram showing the calculation unit 142 and the periphery of the AVC ECU 130 according to the second embodiment. As shown in FIG. 6, the calculation unit 142 includes reference signal generation units 150a, 150b, adaptive filters 152a, 152b, reference signal correcting units 154a, 154b, filter coefficient computing units 156a, 156b, fade-out processing units 158a, 158b, a first autocorrelation value calculation units 160a, 160b, second autocorrelation value calculation units 160c, 160d and output switching units 162a, 162b.

(B-1-2-2-3-2. Reference Generation Units 150a, 150b)

The reference signal generation units 150a, 150b generate the reference signals Sr2, Sr3 based on the CRK pulse Pcrk as the basic signal, and output them to the adaptive filters 152a, 152b, the reference signal correcting units 154a, 154b, the first autocorrelation value calculation units 160a, 160b and the output switching units 162a, 162b.

(B-1-2-2-3-3. Adaptive Filters 152a, 152b)

The adaptive filters 152a, 152b are, for example, FIR (Finite Impulse Response) type or adaptive notch type filters. The adaptive filters 152a, 152b perform adaptive filter processing using the filter coefficients W2, W3 on the reference signals Sr2, Sr3 to output the control signals Sc2, Sc3. As described above, the control signals Sc2, Sc3 indicate the canceling vibration CV.

(B-1-2-2-3-4. Reference Signal Correcting Unit 154a, 154b)

The reference signal correction units 154a, 154b generate the correction reference signals Srr2, Srr3 by performing transfer function processing on the reference signals Sr2, Sr3. The correction reference signals Srr2, Srr3 are used in filter coefficient computing units 156a, 156b to calculate filter coefficients W2, W3. The transfer function process is a process for correcting the reference signals Sr2, Sr3 based on the transfer functions $Ce_2$, $Ce_3$ (filter coefficients) of the canceling vibration CV from the actuators 132a, 132b to the acceleration sensors 134a, 134b. The transfer functions $Ce_2$ and $Ce_3$ used in this transfer function processing are measured values or predicted values ($C_2\hat{}$, $C_3\hat{}$) of the actual transfer functions $C_2$, $C_3$ of the canceling vibration CV from the actuators 132a, 132b to the acceleration sensors 134a, 134b.

(B-1-2-2-3-5. Filter Coefficient Computing Unit 156a, 156b)

The filter coefficient computing units 156a, 156b (hereinafter also referred to as "computing units 156a, 156b") sequentially calculates and updates the filter coefficients W2 and W3. The computing units 156a, 156b calculate the filter coefficients W2 and W3 using adaptive algorithm operation {e.g., least squares method (LMS) algorithm operation}. That is, on the basis of the correction reference signals Srr2, Srr3 from the reference signal correction units 154a, 154b and the error signals e2, e3 from the acceleration sensors 134a, 134b, the computing units 156a, 156b calculate filter coefficients W2, W3 so that the square of the error signal e2 $(e2)^2$ and the square of the error signal e3 $(e3)^2$ are zero. The specific calculation in the filter coefficient computing units 156a, 156b can be performed in the same manner as in US 2012/0032619 A1, for example.

(B-1-2-2-3-5. Fade-Out Processing Unit 158a, 158b)

The fade-out processing units 158a, 158b perform fade-out processing based on a command from the output switching units 162a, 162b. The fade-out process is a process of gradually decreasing the filter coefficients W2, W3 of the adaptive filters 152a, 152b to stop the output of the canceling vibration CV.

(B-1-2-2-3-7. First Autocorrelation Value Calculation Units 160a, 160b and Second Autocorrelation Value Calculation Units 160c, 160d)

The first autocorrelation value calculation units 160a, 160b (hereinafter also referred to as "calculation units 160a, 160b") calculate the autocorrelation values Va1 (first autocorrelation values Va1) of the reference signals Sr2, Sr3 and output them to the output switching units 162a, 162b. The method of calculating the first autocorrelation values Va1 is the same as that in the first embodiment.

The second autocorrelation value calculation units 160c, 160d (hereinafter also referred to as "calculation units 160c, 160d") calculate the autocorrelation values Va2 (second autocorrelation values Va2) of the error signals e2. e3 and output them to the output switching units 162a, 162b. The method of calculating the second autocorrelation values Va2 is the same as that in the first embodiment.

(B-1-2-2-3-8. Output Switching Units 162a, 162b)

The output switching units 162a, 162b (canceling output limiting unit) switches the output of the canceling vibration CV based on various kinds of information. The information here includes information on the first autocorrelation value Va1, the second autocorrelation value Va2, the reference signals Sr2, Sr3 (the amplitude As and the difference ΔVef between the effective values Vef) and information on the error signals e2, e3 (difference ΔVef in the amplitude As and the effective value Vef). Details of the operation of the output switching units 162a, 162b will be described later with reference to FIG. 7.

(B-1-2-2-4. Storage Unit 144)

The storage unit 144 has a nonvolatile memory and a volatile memory, and stores programs and data used by the calculation unit 142.

[B-1-3. Actuators 132a, 132b]

The actuators 132a and 132b (canceling output generating unit) are disposed between the engine 40 and a subframe (not shown) that supports the engine 40. An actuator 132a (hereinafter also referred to as "front side actuator 132a") is arranged to support the front side of the engine 40. An actuator 132b (hereinafter also referred to as "rear side actuator 132b") is arranged to support the rear side of the engine 40.

Each of the actuators 132a, 132b suppresses the transmission of the vibration EV from the engine 40 to the subframe by repeating the advancing and retracting operation based on the command (the control signals Sc2, Sc3) from the AVC ECU 130. As a specific configuration of the actuators 132a, 132b, for example, those described in US 2012/0032619 A1 can be used. In FIG. 6, the front side actuator 132a is denoted as "FR ACT", and the rear side actuator 132b is denoted as "RR ACT".

[B-1-4. Acceleration Sensors 134a, 134b]

An acceleration sensor 134a (hereinafter also referred to as "front side acceleration sensors 134a") is disposed in the vicinity of the front side actuator 132a in the subframe. The acceleration sensors 134a, 134b (error detection unit) detect the engine vibration EV transmitted to the vicinity of the front side actuator 132a as the acceleration Gf. The acceleration Gf here means the acceleration in the expansion/contraction direction of the actuator 132a. The error signal e2 indicating the acceleration Gf is transmitted to the filter coefficient computing unit 156a, the second autocorrelation value calculation unit 160c, and the output switching unit 162a.

An acceleration sensor 134b (hereinafter also referred to as "rear side acceleration sensor 134b") is arranged in the vicinity of the rear side actuator 132b in the subframe. The acceleration sensor 134b (error detection unit) detect the engine vibration EV transmitted to the vicinity of the rear side actuator 132b as the acceleration Gr. The acceleration Gr here means the acceleration in the expansion/contraction direction of the actuator 132b. The error signal e3 indicating the acceleration Gr is transmitted to the filter coefficient computing unit 156b, the second autocorrelation value calculation unit 160d, and the output switching unit 162b. As a specific configuration of the acceleration sensors 134a, 134b, known ones (for example, those described in US 2012/0032619 A1) can be used. In FIG. 6, the front side acceleration sensor 134a is denoted as "FR G sensor", and the rear side acceleration sensor 134b is denoted as "RR G sensor".

<B-2. Various Controls in the Second Embodiment>

[B-2-1. Autocorrelation Value Calculation Control]

In the second embodiment, an autocorrelation value calculation control is executed in the same manner as in the first embodiment (FIG. 3). As described above, the autocorrelation value calculating control is a control of calculating the autocorrelation value Va of the target signal Star. In the case of calculating the first autocorrelation value Va1 in the second embodiment, the target signal Star is the reference signals Sr2, Sr3, whereas in the case of calculating the second autocorrelation value Va2, the target signal Star is the error signals e2, e3.

The first autocorrelation value calculation units 160a, 160b execute the autocorrelation value calculation control when calculating the first autocorrelation value Va1. The second autocorrelation value calculation units 160c, 160d execute the autocorrelation value calculation control when calculating the second autocorrelation value Va2. The processing as shown in FIG. 3 is executed at every predetermined calculation cycle.

[B-2-2. Canceling Vibration Output Switching Control]

Figure 7:
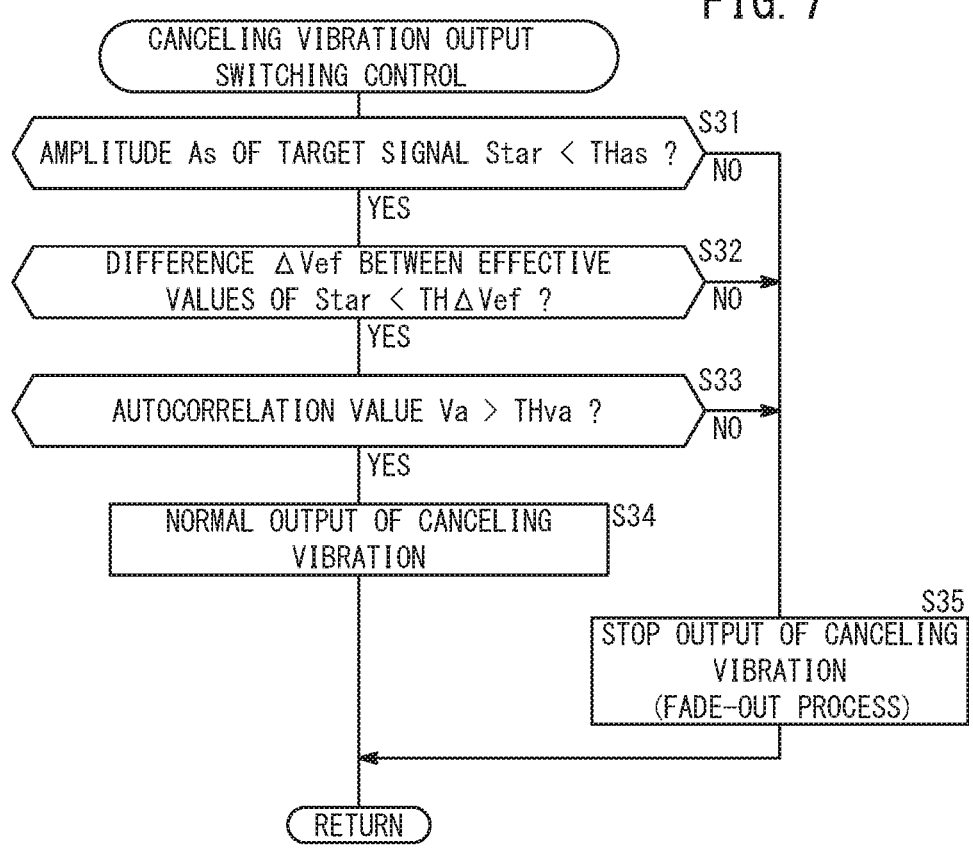
FIG. 7 is a flowchart of canceling vibration output switching control according to the second embodiment.

FIG. 7 is a flowchart of canceling vibration output switching control in the second embodiment. The canceling vibration output switching control is a control for switching the output of the canceling vibration CV and is executed by the output switching units 162a, 162b. The process of FIG. 7 is executed at every predetermined calculation cycle.

In step S31 of FIG. 7, the output switching units 162a, 162b determine whether or not the amplitude As of the target signal Star is lower than the amplitude threshold value THas. Specifically, in the case where the target signal Star is the reference signal Sr2, Sr3, the output switching units 162a, 162b determines whether or not the amplitude As of the reference signal Sr2, Sr3 is smaller than the amplitude threshold value THas. In the case where the target signal Star is the error signal e2, e3, the output switching units 162a, 162b determines whether or not the amplitude As of the error signal e2, e3 is smaller than the amplitude threshold value THas.

The amplitude threshold value THas is a threshold value for determining whether or not the amplitude As of the target signal Star is so large that it is not suitable for outputting the canceling vibration CV. In other words, when the amplitude As exceeds the amplitude threshold value THas, the amplitude As is too large to sufficiently exhibit the vibration suppression effect by the canceling vibration CV. When the amplitude As is smaller than the amplitude threshold value THas (S31: YES), the process proceeds to step S32.

In step S32, the output switching unit 84 determines whether or not the difference ΔVef of the effective values Vef of the target signal Star falls below the difference threshold THΔVef. The difference ΔVef here is the difference between the previous value and the current value.

Specifically, in the case where the target signal Star is the reference signal Sr2, Sr3, the output switching units 162a, 162b determines whether or not the difference ΔVef of the effective values Vef of the reference signal Sr2, Sr3 is smaller than the difference threshold THΔVef.

In the case where the target signal Star is the error signal e2, e3, the output switching units 162a, 162b determines whether or not the difference ΔVef of the effective values Vef of the error signal e2, e3 is smaller than the difference threshold THΔVef.

The difference threshold value THΔVef is a threshold value for determining whether or not the difference ΔVef is so small that it is suitable for outputting the canceling vibration CV. In other words, when the difference ΔVef exceeds the difference threshold value THΔVef, the change in the target signal Star is too large to sufficiently exhibit the vibration suppression effect by the canceling vibration CV. When the difference ΔVef is smaller than the difference threshold value THΔVef (S32: YES), the process proceeds to step S33.

In step S33, the output switching units 162a, 162b determine whether or not the autocorrelation value Va exceeds the autocorrelation threshold value THva. Specifically, when the target signal Star is the reference signals Sr2, Sr3, the output switching units 162a, 162b determine that the first autocorrelation value Va1 of the reference signals Sr2, Sr3 exceeds the correlation threshold value THva (first autocorrelation threshold value THva1). When the target signal Star is the error signals e2, e3, the output switching units 162a, 162b determine whether or not the second autocorrelation value Va2 of the error signals e2, e3 exceeds the correlation threshold value THva (the second autocorrelation threshold value THva 2).

The correlation threshold value THva is a threshold value for determining whether or not the autocorrelation value Va is large enough to output canceling vibration CV. In other words, when the autocorrelation value Va is lower than the correlation threshold value THva, there is a high possibility that the disturbance has entered the target signal Star, and the vibration suppression effect by the canceling vibration CV is not sufficiently exhibited. When the autocorrelation value Va exceeds the correlation threshold value THva (S33: YES), the process proceeds to step S34.

In step S34, the output switching units 162a, 162b perform normal output of the canceling vibration CV. If any of the steps S31 to S33 is NO, the output switching units 162a, 162b stop the output of the canceling vibration CV in step S35. At that time, the output switching units 162a, 162b cause the fade-out processing units 158a, 158b to execute the fade-out processing to fade out the canceling vibration CV.

<B-3. Effects of the Second Embodiment>

According to the second embodiment as described above, in addition to or in place of the effects of the first embodiment, the following effects can be exerted.

That is, in the second embodiment, in the case where it is determined that the autocorrelation values Va (Va1, Va2) of the target signal Star (the error signals e2, e3 and the reference signals Sr2, Sr3) are lower than the autocorrelation threshold values THva (THva1, THva2) (S33: NO in FIG. 7), the increase in canceling vibration CV (canceling output) is limited (S35). Thereby, when the influence of the disturbance entering the error signals e2, e3 or the reference signals Sr2, Sr3 or the crank pulse Pcrk (reference signal) is large, by limiting the increase of the canceling vibration CV, divergence of control or occurrence of unintended canceling vibration CV can be prevented.

C. Third Embodiment

<C-1. Configuration of the Third Embodiment (Difference from First Embodiment)>

The configuration of the hardware of the third embodiment is the same as that of the first embodiment (FIGS. 1 and 2). Therefore, the same reference numerals are allotted to the same constituent elements as those in the first embodiment, and a detailed description thereof will be omitted. In the third embodiment, the canceling sound output switching control is different from that in the first embodiment (FIG. 4).

<C-2. Canceling Sound Output Switching Control According to Third Embodiment>

[C-2-1. Flow of Canceling Sound Output Switching Control of Third Embodiment]

Figure 8:
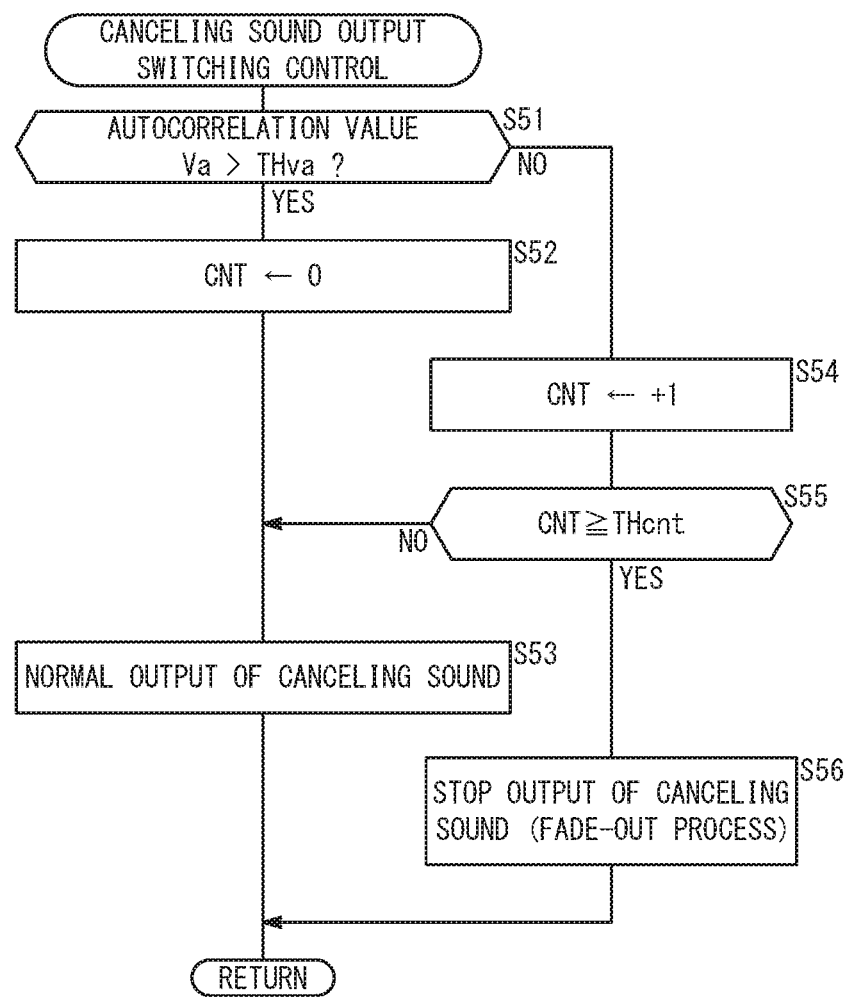
FIG. 8 is a flow chart of canceling sound output switching control according to the third embodiment.

FIG. 8 is a flow chart of canceling sound output switching control according to the third embodiment. The canceling sound output switching control is control for switching the output of the canceling sound CS, and is executed by the output switching unit 84. The process of FIG. 8 is executed at every predetermined calculation cycle.

In step S51 of FIG. 8, the output switching unit 84 determines whether the autocorrelation value Va exceeds the autocorrelation threshold value THva. Step S51 is the same as step S25 in FIG. 4. When the autocorrelation value Va exceeds the correlation threshold value THva (S51: YES), in step S52, the output switching unit 84 resets the count value CNT. The count value CNT increases from the initial value of zero as the state where the autocorrelation value Va is equal to or lower than the correlation threshold value THva continues. In other words, the count value CNT indicates the number of times that the autocorrelation value Va is equal to or less than the correlation threshold value THva (or the number of calculation cycles Ts of the autocorrelation value Va). In the following step S53, the output switching unit 84 performs the normal output of the canceling sound CS.

Returning to step S51, in the case where the autocorrelation value Va does not exceed the correlation threshold value THva (S51: NO), i.e., if the autocorrelation value Va is equal to or less than the correlation threshold value THva, the process proceeds to step S54. In step S54, the output switching unit 84 increases the count value CNT by one.

In step S55, the output switching unit 84 determines whether the count value CNT is greater than or equal to the count threshold value THcnt. The count threshold value THcnt (number-of-times threshold value) is a threshold value for determining whether or not the state in which the autocorrelation value Va is low, and is 3 in the present embodiment. The count threshold value THcnt may be another value (for example, any one of 2, 4 to 10). In the case where the count value CNT is not equal to or greater than the count threshold value THcnt (S55: NO), in step S53, the output switching unit 84 performs normal output of the canceling sound CS.

When the count value CNT is equal to or larger than the count threshold value THcnt (S55: YES), in step S56, the output switching unit 84 stops outputting the canceling sound CS. Step S56 is performed in the same manner as step S28 of FIG. 4.

[C-2-2. Application Example of Canceling Sound Output Switching Control of Third Embodiment]

Figure 9:
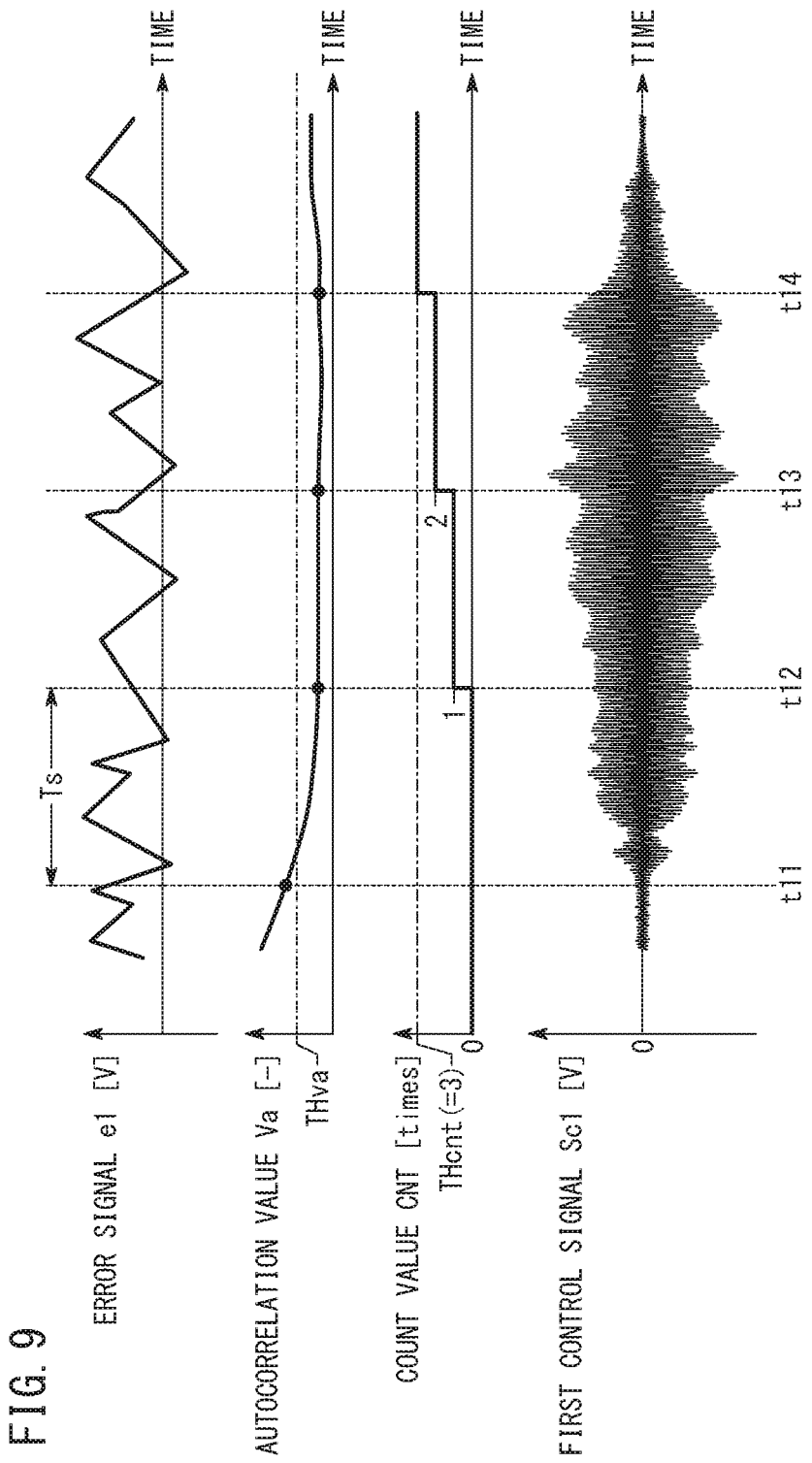
FIG. 9 is a time chart showing an example of a first error signal, an autocorrelation value, a count value, and a first control signal during an execution of the canceling sound output switching control according to the third embodiment.

FIG. 9 is a timeline chart showing an example of the error signal e1, the autocorrelation value Va, the count value CNT and the first control signal Sc1 during execution of the canceling sound output switching control according to the third embodiment. In FIG. 9, the autocorrelation value Va is calculated for each predetermined calculation cycle Ts.

In FIG. 9, at the time point t11, the autocorrelation value Va exceeds the correlation threshold value THva (S51 in FIG. 8: YES). For this reason, the output switching unit 84 performs normal output of the canceling sound CS (S53). At the time point t12, the autocorrelation value Va is equal to or lower than the correlation threshold value THva (S51: NO in FIG. 8). Therefore, the output switching unit 84 increases the count value CNT by 1 to be 1 (S54). In this case, since the count value CNT is not equal to or greater than the count threshold value THcnt (S55: NO), the output switching unit 84 continues the normal output of the canceling sound CS (S53).

Even at the time t13, the autocorrelation value Va is equal to or lower than the correlation threshold value THva (S51 in FIG. 8: NO). Therefore, the output switching unit 84 increases the count value CNT by 1 to be 2 (S54). Also in this case, since the count value CNT is not equal to or greater than the count threshold value THcnt (S55: NO), the output switching unit 84 continues the normal output of the canceling sound CS (S53).

Even at the time t14, the autocorrelation value Va is equal to or lower than the correlation threshold value THva (S51: NO in FIG. 8). Therefore, the output switching unit 84 increases the count value CNT by 1 to be 3 (S54). In this case, since the count value CNT is equal to or greater than the count threshold value THcnt (S55: YES), the output switching unit 84 stops outputting the canceling sound CS (S56).

<C-3. Effect of Third Embodiment>

According to the third embodiment as described above, in addition to or in place of the effects of the first embodiment and the second embodiment, the following effects can be obtained.

That is, in the third embodiment, the output switching unit 84 (canceling output limiting unit) determines whether or not the autocorrelation value Va falls below the autocorrelation threshold value THva at every calculation cycle Ts (first predetermined cycle) (S51 in FIG. 8), while the number of times that the autocorrelation value Va falls below the correlation threshold value THva is counted as the count value CNT (S54). When the count value CNT has reached the count threshold value THcnt (S55: YES), the output switching unit 84 limits the increase in the canceling output (S56). This makes it possible to increase the reliability of the determination that the autocorrelation value Va of the error signal e1 (target signal) is lower than the correlation threshold value THva.

D. Fourth Embodiment

<D-1. Configuration of Fourth Embodiment (Difference from First Embodiment)>

Figure 10:
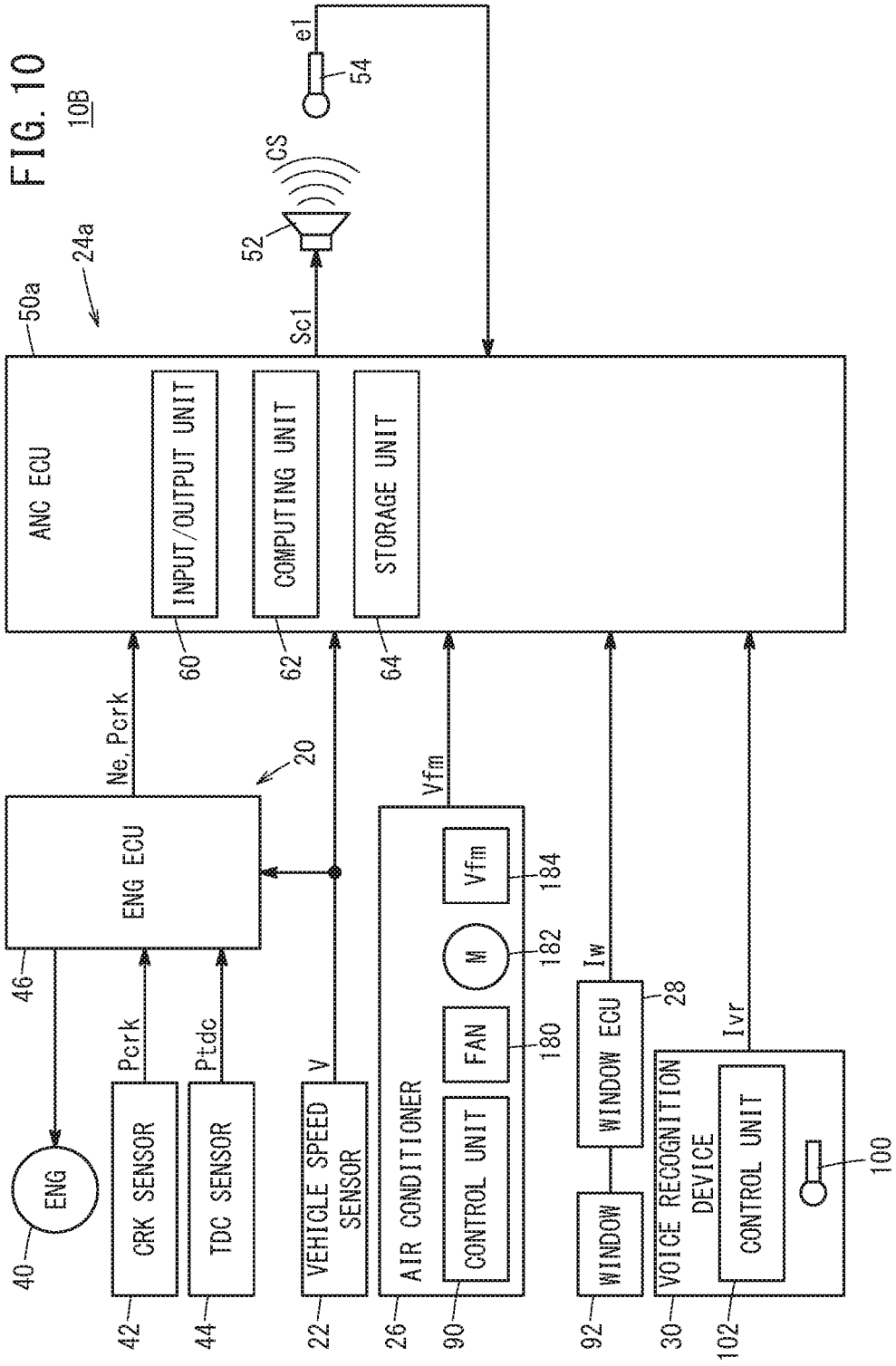
FIG. 10 is a diagram showing a schematic configuration of a vehicle equipped with an active noise control apparatus as an active vibration noise control apparatus according to a fourth embodiment of the present invention.

FIG. 10 shows a schematic view of a vehicle 10B on which an active noise control apparatus 24a (hereinafter referred to as "ANC apparatus 24a") is mounted as an active vibration noise control apparatus according to a fourth embodiment of the present invention. The configuration of the hardware of the fourth embodiment is basically the same as that of the first embodiment. Therefore, the same reference numerals are allotted to the same constituent elements as those in the first embodiment, and a detailed description thereof will be omitted.

In the air conditioner 26 of FIG. 10, in addition to the control unit 90, a fan 180, a fan motor 182 and a voltage sensor 184 are shown as constituent elements thereof (the air conditioner 26 in FIG. 1 may have these constituent elements). The motor 182 drives the fan 180 based on a command from the control unit 90. The voltage sensor 184 detects a voltage Vfm (hereinafter also referred to as "applied voltage Vfm") applied from a battery (not shown) to the motor 182 based on a command from the control unit 90. The detected applied voltage Vfm is input to the active noise control electronic control unit 50a (hereinafter referred to as "ANC ECU 50a").

The applied voltage Vfm varies according to the duty ratio of the drive signal input from the control unit 90 to a switching element (not shown) disposed between the battery and the motor 182. Alternatively, when a DC/DC converter (not shown) is provided between the battery and the motor 182, the applied voltage Vfc varies according to the drive signal from the control unit 90 to this DC/DC converter.

Like the ANC ECU 50 (FIG. 2) of the first embodiment, the ANC ECU 50a has an output switching unit 84. The output switching unit 84 of the first embodiment performs the canceling sound output switching control using the air volume Dec of the air conditioner 26 (S23 in FIG. 4). On the other hand, the output switching unit 84 of the fourth embodiment performs the canceling sound output switching control using the applied voltage Vfm (S61 in FIG. 11).

<D-2. Canceling Sound Output Switching Control According to Fourth Embodiment>

Figure 11:
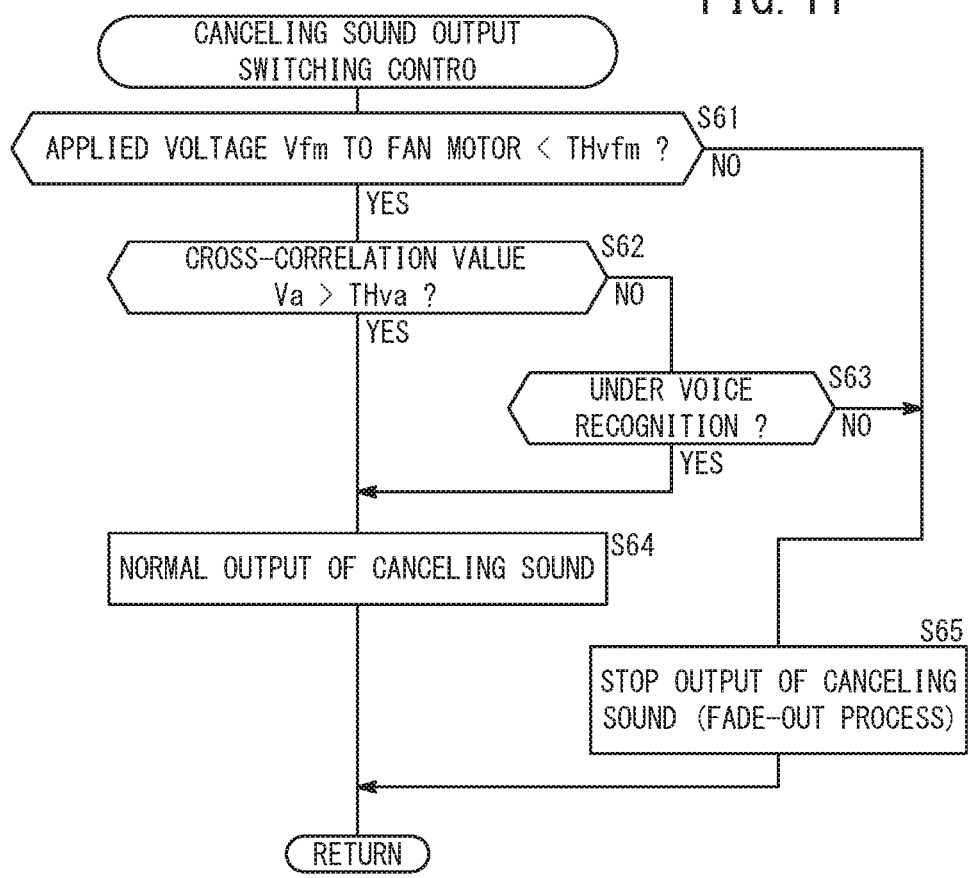
FIG. 11 is a flowchart of a canceling sound output switching control according to the fourth embodiment.

FIG. 11 is a flowchart of the canceling sound output switching control according to the fourth embodiment. The canceling sound output switching control is a control for switching the output of the canceling sound CS, and is executed by the output switching unit 84 of the computing unit 62. The process of FIG. 11 is executed at every predetermined calculation cycle.

In step S61 of FIG. 11, the output switching unit 84 determines whether or not the voltage Vfm applied to the fan motor 182 is lower than the voltage threshold value THvfm. The voltage threshold value THvfm is a threshold value for determining whether or not the air volume Dec of the air conditioner 26 is small enough to output the canceling sound CS. In other words, when the applied voltage Vfm exceeds the voltage threshold value THvfm, the output sound of the air conditioner 26 is too large, so that the silencing effect by the canceling sound CS is not sufficiently exhibited.

When the applied voltage Vfm is lower than the voltage threshold value THvfm (S61: YES), the process proceeds to step S62. When the applied voltage Vfm does not fall below the voltage threshold value THvfm (S61: NO), the process proceeds to step S65. Steps S62 to S65 are the same as steps S25 to S28 of FIG. 4.

<D-3. Effect of Fourth Embodiment>

According to the fourth embodiment as described above, in addition to or in place of the effects of the first to third embodiments, the following effects can be obtained.

That is, in the fourth embodiment, the ANC ECU 50a (adaptive control circuit) acquires the voltage Vfm to be applied to the motor 182 for driving the fan 180 of the air conditioner 26 of the vehicle 10B where the ANC apparatus 24a (active vibration noise control apparatus) is mounted, and determines whether or not the applied voltage Vfm exceeds the voltage threshold value THvfm (S61 in FIG. 11). If the applied voltage Vfm exceeds the voltage threshold value THvfm (S61: NO), the ANC ECU 50 limits the increase of the filter coefficient W1 (FIG. 2) regardless of whether or not the cross-correlation value Vc exceeds the cross-correlation threshold value THvc (S65).

Thus, when the air volume Dec of the air conditioner 26 becomes excessively large, it is possible to prevent the divergence of control or the occurrence of unintended canceling sound CS by limiting the increase of the filter coefficient W1.

E. Fifth Embodiment

<E-1. Configuration of Fifth Embodiment (Difference from First Embodiment)>

Figure 12:
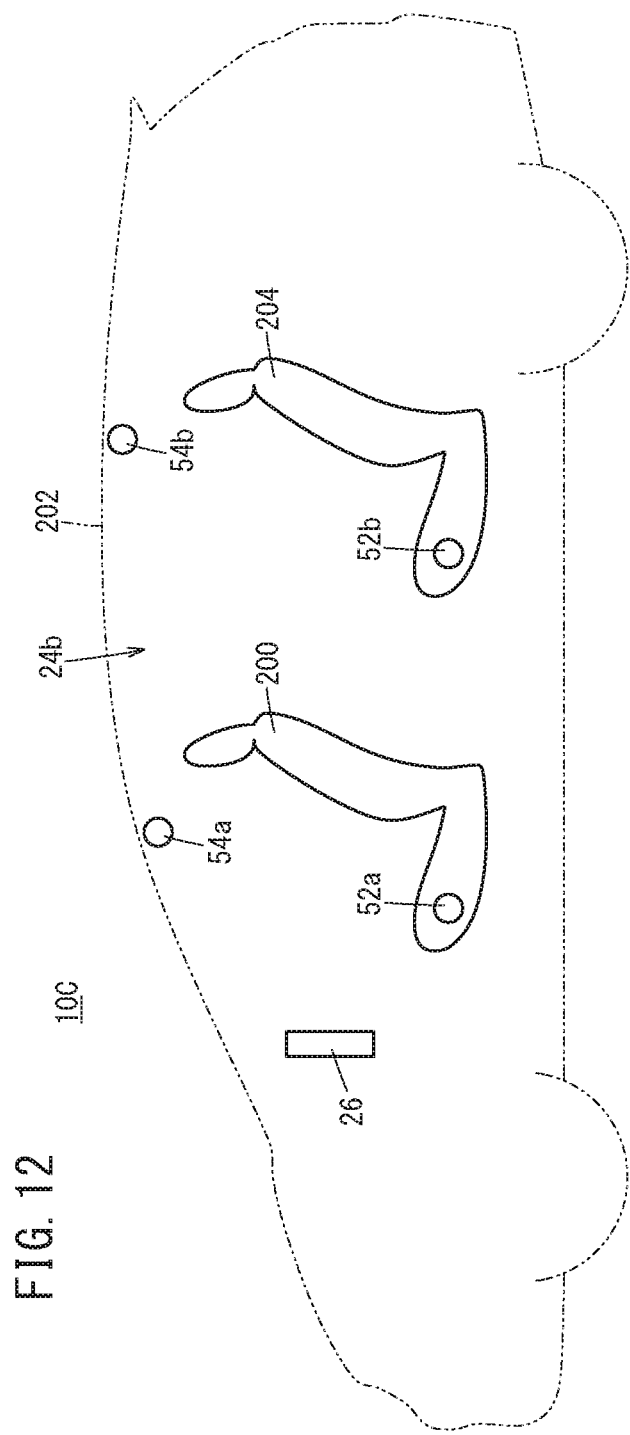
FIG. 12 is a diagram showing the arrangement of each part in a vehicle equipped with an active noise control apparatus as an active vibration noise control apparatus (ANC device) according to a fifth embodiment of the present invention.
Figure 13:
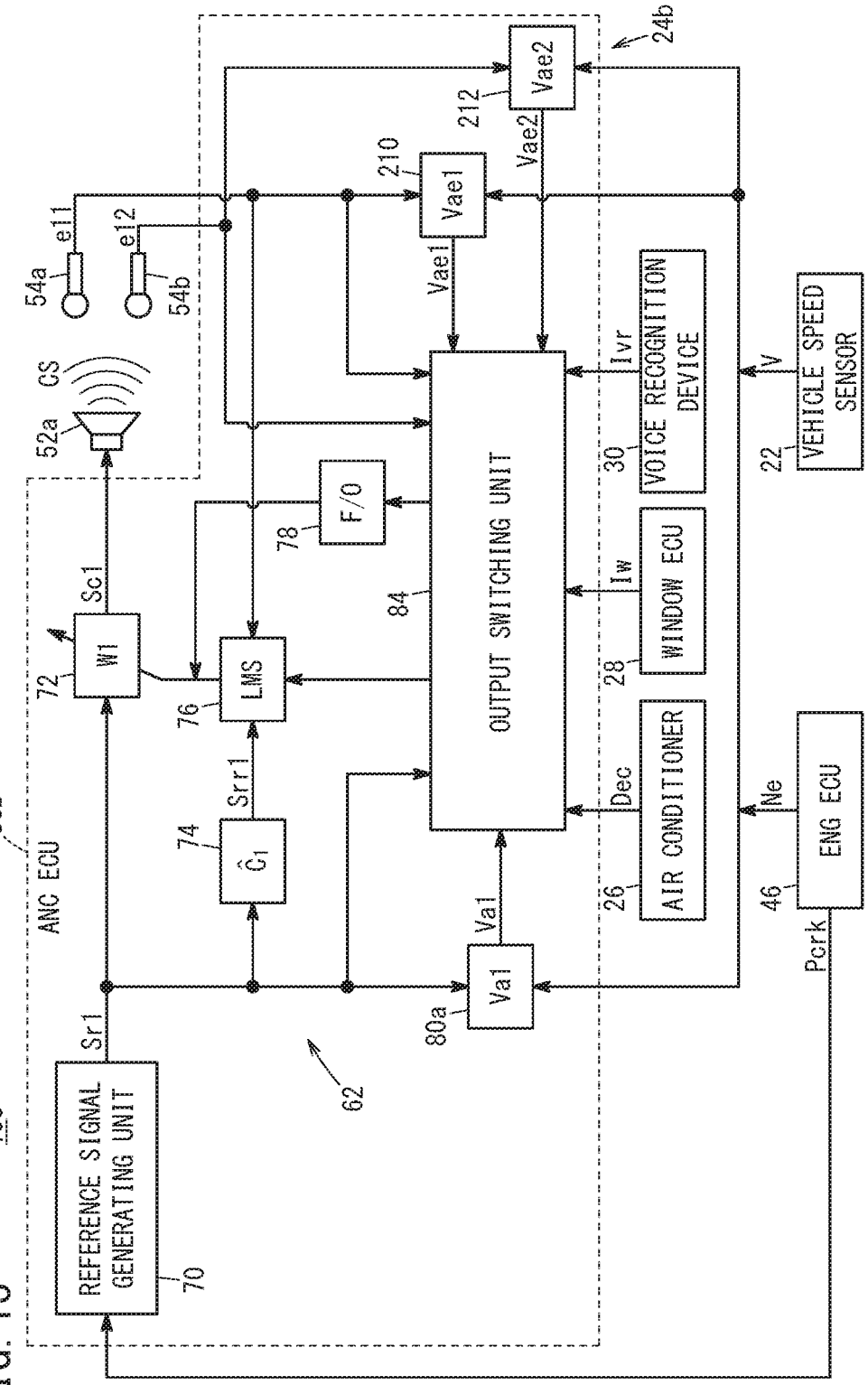
FIG. 13 is a block diagram showing a computing unit and its periphery of the active noise control electronic control device according to the fifth embodiment.

FIG. 12 shows a schematic view of a vehicle 10C on which an active noise control apparatus 24b (hereinafter referred to as "ANC apparatus 24b") is mounted as an active vibration noise control apparatus according to a fifth embodiment of the present invention. The vehicle 10C includes an air conditioner 26, two first speakers 52a, two second speakers 52b, a first microphone 54a, and a second microphone 54b. FIG. 13 is a block diagram showing a computing unit 62 of an active noise control electronic control unit 50b (hereinafter referred to as "ANC ECU 50b") included in the ANC apparatus 24b according to the fifth embodiment.) and the periphery thereof.

The configuration of the hardware of the fifth embodiment is basically the same as that of the first embodiment. Therefore, the same reference numerals are allotted to the same constituent elements as those in the first embodiment, and a detailed description thereof will be omitted.

In the ANC apparatus 24 (FIG. 2) of the first embodiment, only a single microphone 54 is shown. On the other hand, the ANC apparatus 24b of the fifth embodiment has a first microphone 54a and a second microphone 54b. As shown in FIG. 12, the first microphone 54a is disposed on the roof 202 above the front seat 200 (for example, a driver's seat). The second microphone 54b is arranged on the roof 202 above the rear seat 204.

In addition, the ANC ECU 50 of the first embodiment only shows a single second autocorrelation value calculation unit 80b corresponding to the microphone 54 (FIG. 2). On the other hand, as shown in FIG. 13, the ANC ECU 50b of the fifth embodiment includes a first error signal autocorrelation value calculation unit 210 (hereinafter also referred to as "autocorrelation value calculation unit 210") corresponding to the first microphone 54a, and a second error signal autocorrelation value calculation unit 212 (hereinafter also referred to as "autocorrelation value calculation unit 212") corresponding to the second microphone 54b. In other words, the output switching unit 84 of the ANC ECU 50b performs canceling sound output switching control using the first error signal e11 from the first microphone 54a and the second error signal e12 from the second microphone 54b.

The autocorrelation value calculation unit 210 of FIG. 13 corresponds to the second autocorrelation value calculation unit 80b of the first embodiment. That is, the autocorrelation value calculation unit 210 calculates the autocorrelation value Vae1 of the first error signal e11 from the first microphone 54a. The autocorrelation value calculation unit 212 calculates the autocorrelation value Vae2 of the second error signal e12 from the second microphone 54b.

As shown in FIG. 12, the air conditioner 26 is disposed on the front side of the front seat 200 (specifically, in an instrument panel (not shown)). Further, the first speaker 52a is disposed on the side (the left side and the right side) of the front seat 200. The second speaker 52b is disposed on the side (left side and right side) of the rear seat 204.

In FIG. 13, a configuration corresponding to one of the two first speakers 52a is shown, but the other first speaker 52a is configured similarly. In addition, each of the two second speakers 52b is configured similarly. In FIG. 13, the first error signal e11 from the first microphone 54a is input to the filter coefficient computing unit 76. In the configuration corresponding to the second speaker 52b, the second error signal e12 from the second microphone 54b close to the second speaker 52b is input to the filter coefficient computing unit 76.

<E-2. Canceling Output Switching Control of Fifth Embodiment>

Figure 14:
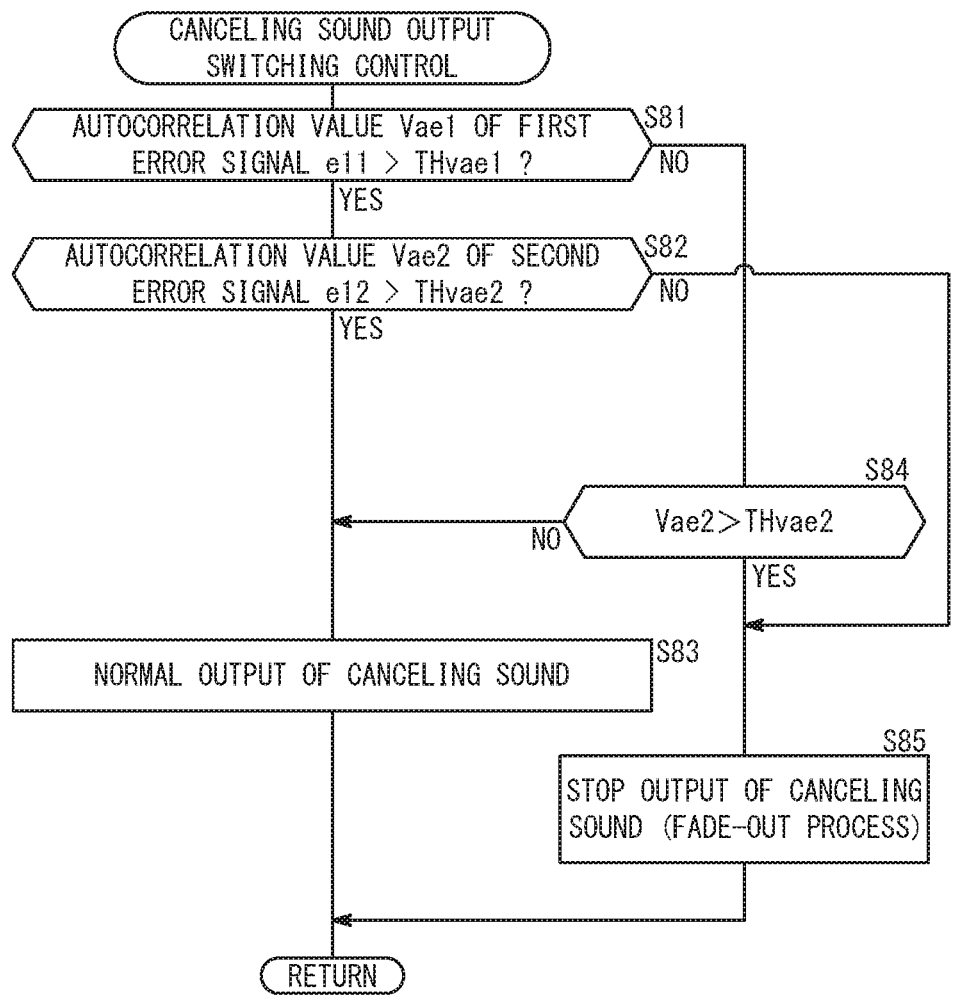
FIG. 14 is a flowchart of a canceling sound output switching control according to the fifth embodiment.

FIG. 14 is a flowchart of the canceling sound output switching control in the fifth embodiment. The canceling sound output switching control is a control for switching the output of the canceling sound CS, and is executed by the output switching unit 84 of the calculating section 62. The process of FIG. 14 is executed at every predetermined calculation cycle. In FIG. 14, only the case where the first error signal e11 and the second error signal e12 are used as the target signal Star is extracted to show the canceling sound output switching control. However, the contents explained in the first embodiment (FIG. 4) and the fourth embodiment (FIG. 11) can be used in combination with the control in FIG. 14.

In step S81 of FIG. 14, the output switching unit 84 determines whether or not the autocorrelation value Vae1 of the first error signal e11 exceeds the front autocorrelation threshold value THvae1 (hereinafter also referred to as "correlation threshold value THvae1"). The correlation threshold value THvae1 is a threshold value for determining whether or not the autocorrelation value Vae1 is large enough to output the canceling sound CS. In other words, when the autocorrelation value Vae1 is lower than the correlation threshold value THvae1, there is a high possibility that a disturbance has entered the target signal Star, and the silencing effect by the canceling sound CS is not sufficiently exerted. In particular, in the fifth embodiment, when the air volume Dec of the air conditioner 26 is relatively large, the autocorrelation value Vae1 is set to be lower than the correlation threshold value THvae1. When the autocorrelation value Vae1 exceeds the correlation threshold value THvae1 (S81: YES), the process proceeds to step S82.

In step S82, the output switching unit 84 determines whether the autocorrelation value Vae2 of the second error signal e12 exceeds the rear side autocorrelation threshold value THvae2 (hereinafter also referred to as "correlation threshold value THvae2). The correlation threshold value THvae2 is a threshold value for determining whether the autocorrelation value Vae2 is large enough to output the canceling sound CS. The rear autocorrelation threshold value THvae2 is set to the same value or different value as the front side autocorrelation threshold value THvae1. When the autocorrelation value Vae2 exceeds the correlation threshold value THvae2 (S82: YES), in step S83, the output switching unit 84 performs normal output of the canceling sound CS.

Returning to step S81, if the autocorrelation value Vae1 of the first error signal e11 does not exceed the front autocorrelation threshold value THvae1 (S81: NO), the process proceeds to step S84. In step S84, the output switching unit 84 determines whether or not the autocorrelation value Vae2 of the second error signal e12 exceeds the rear side autocorrelation threshold value THvae2. Step S84 is the same as step S82. When the autocorrelation value Vae2 does not exceed the correlation threshold value THvae2 in step S84 (S84: NO), in step S83, the output switching unit 84 performs normal output of the canceling sound CS.

When the autocorrelation value Vae2 of the second error signal e2 does not exceed the rear side autocorrelation threshold value THvae2 (S82: NO) or when the autocorrelation value Vae2 exceeds the correlation threshold value THvae2 at S84 (S84: YES) at the step S82, the process proceeds to step S85. In step S85, the output switching unit 84 stops the output of the canceling sound CS. At that time, the output switching unit 84 causes the fade-out processing unit 78 to execute a fade-out process to fade out the canceling sound CS.

<E-3. Effects of Fifth Embodiment>

According to the fifth embodiment as described above, in addition to or in place of the effects of the first to fourth embodiments, the following effects can be obtained.

That is, in the fifth embodiment, when the autocorrelation value Vae1 of the first error signal e11 falls below the front autocorrelation threshold value THvae1 (S81 in FIG. 14:

NO) and the autocorrelation value Vae2 of the second error signal e12 does not fall below the rear side autocorrelation threshold value THvae2 (S84: YES), the increase of the canceling sound CS (canceling output) is limited (S85). Thus, when the influence of the disturbance entering the first error signal e11 is large (for example, when the wind from the air conditioner 26 has reached only the position of the first microphone 54a (the first evaluation point on the front seat side)), by limiting an increase in the canceling sound CS, it is possible to prevent divergence of control or occurrence of unintended canceling sound CS.

Further, according to the fifth embodiment, in the case where the autocorrelation value Vae1 of the first error signal e11 falls below the front autocorrelation threshold value THvae1 (S81: NO) and the autocorrelation value Vae2 of the second error signal e12 falls below the rear side autocorrelation threshold value THvae2 (S84: NO), an increase in canceling sound CS is permitted (S83). Thereby, an event of lowering the autocorrelation values Vae1, Vae2 (for example, an occurrence of road noise) occurs at both the position of the first microphone 54a (the first evaluation point on the front seat side) and the position of the second microphone 54b (the second evaluation point on the rear seat side), the increase in canceling sound CS is permitted. Therefore, when such an event occurs, it is possible to continue the output of the canceling sound CS to raise the autocorrelation values Vae1, Vae2 on both the front seat side and the rear seat side.

F. Application of the Present Invention

The present invention is not limited to the above embodiments, but it goes without saying that various configurations can be adopted based on the description contents of this specification. For example, the following structure can be adopted.

<F-1. Application Targets>

In the above embodiments, the ANC apparatuses 24, 24a, 24b and the AVC apparatus 120 as the active vibration noise control apparatus are applied to the vehicles 10, 10A, 10B, 10C (FIGS. 1, 5, 10, 12 and 13). However, it is not limited thereto, for example, from the viewpoint of canceling the target noise (vibration noise VN) or target vibration (engine vibration EV). For example, it is also possible to apply the ANC apparatus 24, 24a, 24b or the AVC apparatus 120 to other devices (manufacturing device, elevator, escalator, etc.).

In the first embodiment, the vibration noise VN of the engine 40 was taken as the target noise (FIG. 1). However, from the viewpoint of canceling the noise, for example, the present invention is not limited thereto. For example, it is possible to use road noise as the target noise. In that case, the basic configuration of JP 07-104767 A or US 2009/0060217 A1 can be used. The same applies to the third to fifth embodiments.

<F-2. Canceling Sound Output Switching Control>

[F-2-1. Target Signal Star]

In the first embodiment, the autocorrelation value Va (Va1, Va2) is calculated with respect to each of the reference signal Sr1 and the error signal e1, and used for the canceling sound output switching control (FIGS. 3 and 4). However, it is not limited thereto, for example, from the viewpoint of canceling the vibration noise VN (or target input). For example, the autocorrelation value Va may be calculated with respect to only one of the reference signal Sr1 and the error signal e1. The same applies to the second to fifth embodiments.

In the case of the first embodiment, the reference signal Sr1 generated by the reference signal generation unit 70 is directly input to the first autocorrelation value calculation unit 80a (FIG. 2). However, it is not limited thereto, for example, from the viewpoint of canceling the vibration noise VN (or target input). For example, the autocorrelation value Va may be calculated using the reference signal Sr1 (correction reference signal Srr1) corrected by the reference signal correction unit 74 or the crank pulse Pcrk as the reference signal. This also applies to the second to fifth embodiments.

[F-2-2. Limitation to Increase of Canceling Output]

In the first embodiment, when the autocorrelation value Va falls below the autocorrelation threshold value THva (S25: NO in FIG. 4), the output of the canceling sound CS is stopped (S28). However, the present invention is not limited thereto, for example, from the viewpoint of limiting the increase in the canceling sound CS (or canceling output) when a disturbance occurs. For example, it is possible to limits the increase in canceling sound CS by setting an upper limit value to the amplitude of canceling sound CS. This also applies to the second to fifth embodiments.

In the first embodiment, the canceling sound output switching control shown in FIG. 4 was performed. However, the present invention is not limited thereto, for example, from the viewpoint of limiting the increase in canceling sound CS (or canceling output) in accordance with the autocorrelation value Va. For example, it is also possible to omit one or more of steps S21, S22, S23, S24, S26 in FIG. 4. This also applies to the second to fifth embodiments (FIGS. 7, 8, 11 and 14).

[F-2-3. Limitation to Calculation of Autocorrelation Value Va]

(F-2-3-1. Method of Calculating Cross Correlation Value Vc)

In the first embodiment, equation (1) is used for calculating the autocorrelation value Va. Alternatively, it is also possible to use the following equation (7).

$$Va1(n) = \frac{1}{N}\sum_{n=1}^{N} Ac1(n) \tag{7}$$

In the equation (7), N represents the sampling number, and n represents a specific natural number (for example, any one of 10 to 1000). The autocorrelation values Va2, Vae1, Vae2 is calculated by a similar method.

(F-2-3-2. Identification of Detected Frequency Fsm)

In the first embodiment, the detected frequency fsm are specified by performing discrete Fourier transformation on the target signal Star (S4, S5 in FIG. 3). However, the present invention is not limited thereto, for example, from the viewpoint of detecting the occurrence of a disturbance in accordance with the temporal change of the target signal Star. For example, instead of the discrete Fourier transform, it is also possible to use a discrete cosine transform or a wavelet transform. This also applies to the second to fifth embodiments.

In the fifth embodiment (FIG. 14), when the autocorrelation value Vae1 of the first error signal e11 exceeds the correlation threshold value THvae1 (S81: YES) and the autocorrelation value Vae2 of the second error signal e12 is lower than the correlation threshold value THvae2 (S82: NO), the output of the canceling sound CS is stopped (S85). However, the present invention is not limited thereto, for example, by paying attention to controlling the output of the canceling sound CS in accordance with whether or not the autocorrelation value Vae1 of the first error signal e11 exceeds the correlation threshold value THvae1. For example, in the case where the autocorrelation value Vae1 of the first error signal e11 exceeds the correlation threshold value THvae1 (S81: YES), it is possible to perform the normal output (S83) of the cancel sound CS regardless of the autocorrelation value Vae2 of the second error signal e12.

(F-2-3-3. Window Function WF)

In the first embodiment, the window length Lw of the window function WF is made variable according to the rotational speed Ne of the engine 40 (S2, S3 in FIG. 3). However, when focusing on the calculation of the detected frequency fsm, for example, the present invention is not limited thereto. For example, it is possible to set the window length Lw to a fixed value. Alternatively, a configuration without using the window function WF is also possible. This also applies to the second to fifth embodiments.

(F-2-3-4. Allowable Lowest Frequency Fmin)

In the first embodiment, in the case where the detection frequency fsm of the target signal Star is lower than the allowable lowest frequency fmin (S7: NO in FIG. 3), the calculation of the autocorrelation value Va is stopped (S9). However, for example, in the case where the detection frequency fsm is lower than the allowable lowest frequency fmin, the present invention is not limited thereto in view of limiting the output of the canceling sound CS. For example, in the case where the detection frequency fsm is lower than the allowable lowest frequency fmin, it is also possible to lower the canceling sound CS. Further, for example, paying attention to the calculation itself of the autocorrelation value Va, the present invention is not limited thereto, and a configuration that does not stop calculating the autocorrelation value Va, without using the allowable lowest frequency fmin is also possible. This also applies to the second to fifth embodiments.

<F-3. Other>

In the first embodiment, each step is executed in the order shown in FIGS. 3 and 4. However, for example, as long as the purpose of each step can be realized (in other words, when the effect of the present invention can be obtained), the order of each step can be interchanged. For example, step S6 in FIG. 3 can be executed before or in parallel with steps S1 to S5. It is also possible to switch the order of steps S21 to S24 in FIG. 4 or to execute them in parallel. This also applies to the second to fifth embodiments.

In each of the above-described embodiments, there are cases where equal numbers are included or not included in numerical comparison (S7 and the like in FIG. 3). However, for example, if there is no special meaning to include an equal sign or to exclude an equal sign (in other words, in the case where the effect of the present invention is obtained), whether to include an equal sign in numerical comparison can be set arbitrarily.

In this sense, for example, the determination in step S7 of FIG. 3 on whether or not each of the detected frequency fsm exceeds the allowable lowest frequency fmin (fsm>fmin) can be replaced with the determination on whether or not each of the detected frequency fsm is equal to or higher than the allowable lowest frequency fmin (fsm fmin).

G. Explanation of Reference Numerals 10, 10A, 10B, 10C . . . vehicle
22 . . . vehicle speed sensor
24, 24a, 24b . . . ANC apparatus (active vibration noise control apparatus)
26 . . . air conditioner
30 . . . voice recognition device
40 . . . engine (running drive source)
42 . . . crank pulse sensor (basic signal generating unit)
50, 50a, 50b . . . ANC ECU (adaptive control circuit, active vibration noise control circuit)
52 . . . speaker (canceling output generation unit)
52a . . . first speaker (canceling output generation unit)
52b . . . second speaker (canceling output generation unit)
54 . . . microphone (error detecting unit)
54a . . . first microphone (first error detecting unit)
54b . . . second microphone (second error detection unit)
72, 152a, 152b . . . adaptive filter
76, 156a, 156b . . . autocorrelation value calculation unit
80a, 160a, 160b . . . first autocorrelation value calculation unit
80b, 160c, 160d . . . second autocorrelation value calculation unit
84, 162a, 162b . . . output switching unit (canceling output limiting unit)
92 . . . window
120 . . . AVC apparatus (active vibration noise control apparatus)
130 . . . AVC ECU (adaptive control circuit, active vibration noise control circuit)
132a, 132b . . . actuator (canceling output generating unit)
134a, 134b . . . acceleration sensor (first error detecting unit)
180 . . . fan
182 . . . motor
210 . . . first error signal autocorrelation value calculation unit
212 . . . second error signal autocorrelation value calculation unit
As . . . amplitude of target signal
CNT . . . count value (number)
CS . . . canceling sound
CV . . . canceling vibration
Dec . . . air volume of air conditioner
EV . . . engine vibration (target vibration)
e1, e2, e3 . . . error signal
e11 . . . first error signal
e12 . . . second error signal
fmin . . . allowable lowest frequency
fsm . . . frequency of target signal
Lw . . . window length
Ne . . . engine rotation number per unit time (rotational speed)
Pcrk . . . crank pulse (basic signal)
Sc1, Sc2, Sc3 . . . control signal
Sr1, Sr2, Sr3 . . . reference signal
Star . . . target signal
THas . . . amplitude threshold value
THcnt . . . count threshold number (number threshold of times)
THdec . . . air volume threshold value
THva . . . autocorrelation threshold value
THva1 . . . first error signal autocorrelation threshold value
THva2 . . . second error signal autocorrelation threshold value
THvfm . . . voltage threshold value
THΔVef . . . difference threshold value
Ts . . . calculation period (predetermined cycle)
V . . . vehicle speed
Va . . . autocorrelation value
Va1 . . . first autocorrelation value Va2 . . . second autocorrelation value
Vfm . . . applied voltage
VN . . . vibration noise (target noise)
WF . . . window function
W1, W2, W3 . . . filter coefficient
ΔVef . . . difference between effective values of the target signal

What is claimed is:

1. An active vibration noise control apparatus comprising:
a basic signal generating unit configured to output a basic signal indicating a target input which is a target noise or a target vibration;
an adaptive control circuit configured to perform an adaptive control on the basic signal to output a control signal;
a canceling output generating unit configured to generate a canceling output as a canceling sound for the target noise or a canceling vibration for the target vibration based on the control signal; and
an error detection unit configured to detect an error as a difference between the canceling output and the target input at a certain evaluation point, and output an error signal,
wherein the adaptive control circuit comprises:
an adaptive filter configured to generate the control signal on a basis of the basic signal or a reference signal based on the basic signal;
a filter coefficient computing unit configured to calculate a filter coefficient of the adaptive filter based on the basic signal or the reference signal and the error signal;
an autocorrelation value calculation unit configured to calculate an autocorrelation value of a target signal, the target signal being the error signal or the reference or basic signal; and
a canceling output limiting unit configured to determine whether or not the autocorrelation value is smaller than a autocorrelation threshold value, and limit an increase in the canceling output in a case where it is determined that the autocorrelation value is smaller than the autocorrelation threshold value.

2. The active vibration noise control apparatus according to claim 1, wherein the autocorrelation value calculation unit is configured to calculate the autocorrelation value of the target signal in a case where the frequency of the target signal is higher than an allowable lowest frequency, and not to calculate the autocorrelation value in a case where the frequency of the target signal is lower than the allowable lowest frequency.

3. The active vibration noise control apparatus according to claim 2, wherein the autocorrelation value calculation unit is configured to:
acquire the vehicle speed of the vehicle in which the active vibration noise control apparatus is disposed, and
switch the allowable lowest frequency according to the vehicle speed.

4. The active vibration noise control apparatus according to claim 1, wherein the adaptive control circuit is configured to:
determine whether or not amplitude of the target signal is greater than an amplitude threshold value, and
limit an increase in the filter coefficient regardless of whether or not the autocorrelation value exceeds the autocorrelation threshold value in a case where the amplitude of the target signal is greater than an amplitude threshold value.

5. The active vibration noise control apparatus according to claim 1, wherein the adaptive control circuit configured to:
calculate a difference between a previous effective value and a current effective value with respect to the target signal,
determine whether or not the differences between the effective values exceed a difference threshold value, and
limit an increase in the filter coefficient regardless of whether or not the autocorrelation value exceeds the autocorrelation threshold value in a case where the difference between the effective values exceeds the difference threshold value.

6. The active vibration noise control apparatus according to claim 1, wherein the adaptive control circuit is configured to:
acquire an air volume of an air conditioner of the vehicle in which the active vibration noise control apparatus is disposed, and
determine whether or not the air volume exceeds an air volume threshold value, and
limit the increase of the filter coefficient regardless of whether or not the autocorrelation value exceeds the autocorrelation threshold value in a case where the air volume exceeds the air volume threshold value.

7. The active vibration noise control apparatus according to claim 1, wherein the adaptive control circuit is configured to:
specify whether or not a window of a vehicle in which the active vibration noise control apparatus is disposed is in an open state; and
limit an increase in a filter coefficient regardless of whether or not the autocorrelation value exceeds the autocorrelation threshold value in a case where the window is in the open state.

8. The active vibration noise control apparatus according to claim 1, wherein the autocorrelation value calculation unit is configured to:
set a window length of a window function that specifies an extraction portion for calculating the autocorrelation value from the target signal, and
calculate the autocorrelation value with respect to the extracted portion specified by using the window length,
obtain a rotational speed of a running drive source of the vehicle in which the active vibration noise control apparatus is disposed, and
change the window length of the window function according to the rotational speed of the running drive source.

9. The active vibration noise control apparatus according to claim 8, wherein the autocorrelation value calculation unit is configured to:
estimate the frequency of the first target signal based on the rotational speed of the running drive source, and
set a reciprocal of the estimated frequency as the window length of the window function.

10. The active vibration noise control apparatus according to claim 1, wherein the error detection unit is a microphone, the target signal contains the error signal, and the adaptive control circuit is configured to:
identify whether or not the voice recognition device of the vehicle where the active vibration noise control apparatus is disposed is performing voice recognition, and
allow an increase in the filter coefficient regardless of whether or not the autocorrelation value falls below the autocorrelation threshold value in a case where the voice recognition device is performing the voice recognition.

11. The active vibration noise control apparatus according to claim 1, wherein the canceling output limiting unit is configured to:
   determine whether or not the autocorrelation value falls below the autocorrelation threshold value at every predetermined period while counting a number of times that the autocorrelation value falls below the autocorrelation threshold; and
   limit the increase in the canceling output when the number of times reaches the threshold number of times.

12. The active vibration noise control apparatus according to claim 1, wherein the adaptive control circuit is configured to:
   obtain a voltage to be applied to a motor that drives a fan of an air conditioner of a vehicle in which the active vibration noise control apparatus is disposed;
   determine whether the applied voltage exceeds a voltage threshold; and
   limit an increase in the filter coefficient regardless of whether the autocorrelation value exceeds the autocorrelation threshold, in a case where the applied voltage exceeds the voltage threshold.

13. An active vibration noise control apparatus comprising:
   a basic signal generating unit configured to output a basic signal indicating a target input which is a target noise or a target vibration;
   an adaptive control circuit configured to perform an adaptive control on the basic signal to output a control signal;
   a canceling output generating unit configured to generate a canceling output as a canceling sound for the target noise or a canceling vibration for the target vibration based on the control signal;
   a first error detection unit configured to detect an error as a difference between the canceling output and the target input at a first evaluation point on a front seat side, and output a first error signal; and
   a second error detection unit configured to detect an error as a difference between the canceling output and the target input at a second evaluation point on a rear seat side, and output a second error signal,
   wherein the adaptive control circuit comprises:
      an adaptive filter configured to generate the control signal on a basis of the basic signal or a reference signal based on the basic signal;
      a filter coefficient calculation unit configured to calculate a filter coefficient of the adaptive filter based on the basic signal or the reference signal and the first error signal;
      a first-error-signal autocorrelation value calculation unit configured to calculate an autocorrelation value of the first error signal;
      a second-error-signal autocorrelation value calculation unit configured to calculate an autocorrelation value of the second error signal; and
      a canceling output limiting unit configured to limit an increase in the canceling output, and
   the canceling output limiting unit configured to:
      limit the increase in the canceling output in a case where it is determined that the autocorrelation value of the first signal is smaller than a front side autocorrelation threshold value and the autocorrelation value of the second error signal exceeds a rear side autocorrelation threshold value, and
      allow the increase in the canceling output in a case where it is determined that the autocorrelation value of the first signal is smaller than the front side autocorrelation threshold value and the autocorrelation value of the second error signal is smaller than the rear side autocorrelation threshold value.

14. An active vibration noise control circuit configured to:
   receive a basic signal indicating a target input that is a target noise or a target vibration from a basic signal generating unit;
   generate a control signal indicating a canceling output as a canceling sound relative to the target noise or a canceling vibration relative to the target vibration by performing an adaptive control on the basic signal; and
   output the control signal to a canceling output generating unit configured to generate the canceling output,
   wherein the active vibration noise control circuit comprises:
   an adaptive filter configured to generate the control signal on a basis of the basic signal or a reference signal based on the basic signal;
   a filter coefficient calculation unit configured to receive, from an error detection unit, an error signal indicative of an error as a difference between the canceling output and the target input at a certain evaluation point, and calculate a filter coefficient of the adaptive filter based on the reference or basic signal and at least one of the first error signal and the second error signal;
   an autocorrelation value calculation unit configured to calculate an autocorrelation value of the target signal, the target signal being the error signal or the reference or basic signal; and
   a canceling output limiting unit configured to determine whether or not the autocorrelation value is lower than the cross correlation threshold value, and limit an increase in the canceling output in a case where it is determined that the autocorrelation value is lower than the cross correlation threshold value.

* * * * *